US007874888B2

(12) United States Patent
Suzuki et al.

(10) Patent No.: US 7,874,888 B2
(45) Date of Patent: Jan. 25, 2011

(54) INSPECTION METHOD AND INSPECTION DEVICE, REPAIRING METHOD AND REPAIRING DEVICE FOR ORGANIC ELECTROLUMINESCENCE PANEL

(75) Inventors: Noriyuki Suzuki, Osaka (JP); Hiroki Kitagawa, Aichi (JP)

(73) Assignee: Panasonic Corporation, Osaka (JP)

( * ) Notice: Subject to any disclaimer, the term of this patent is extended or adjusted under 35 U.S.C. 154(b) by 41 days.

(21) Appl. No.: 12/492,455

(22) Filed: Jun. 26, 2009

(65) Prior Publication Data

US 2009/0325450 A1 Dec. 31, 2009

(30) Foreign Application Priority Data

Jun. 27, 2008 (JP) .............................. 2008-168689

(51) Int. Cl.
*H01J 9/50* (2006.01)
*G09G 3/30* (2006.01)

(52) U.S. Cl. ................................ 445/2; 345/76; 345/84

(58) Field of Classification Search ............... 445/2, 445/3, 5, 6; 345/76, 84, 77, 204, 690
See application file for complete search history.

(56) References Cited

U.S. PATENT DOCUMENTS 7,728,797 B2 * 6/2010 Nagayama .................. 345/76

FOREIGN PATENT DOCUMENTS

JP 2006-323032 11/2006

OTHER PUBLICATIONS

Kentaro Shima "'94 Market of Liquid Crystal Display Peripheral Material and Chemicals", Jun. 20, 1994, CMC Co., Ltd., pp. 169, 170, 175 and 177 (along with English translation).

* cited by examiner

*Primary Examiner*—Joseph L Williams
(74) *Attorney, Agent, or Firm*—Wenderoth, Lind & Ponack, L.L.P.

(57) ABSTRACT

An inspection method for an organic electroluminescence panel of the present invention includes the steps of: applying a predetermined voltage to each of pixels of color filters of respective types relative to an organic electroluminescence panel on which the color filters of the respective types are installed; with respect to leakage light generated from the organic electroluminescence panel, detecting the leakage light transmitted from each of the color filters of the respective types; adjusting each of the amounts of light emissions of the leakage light detected from the color filters of the respective types so as to be set within reference permissible values for each of the color filters of all the types; and based upon the amount of light emission of each of the leakage light detected from the color filters of the respective types of the organic electroluminescence panel, inspecting the organic electroluminescence panel.

10 Claims, 16 Drawing Sheets

Fig. 12
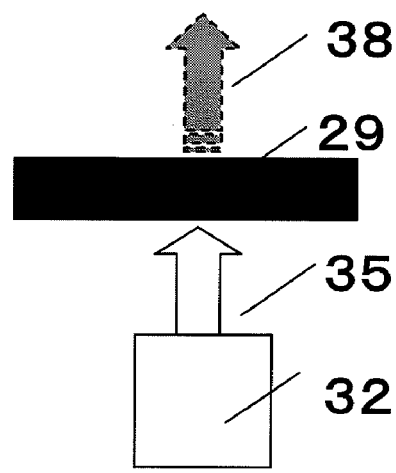
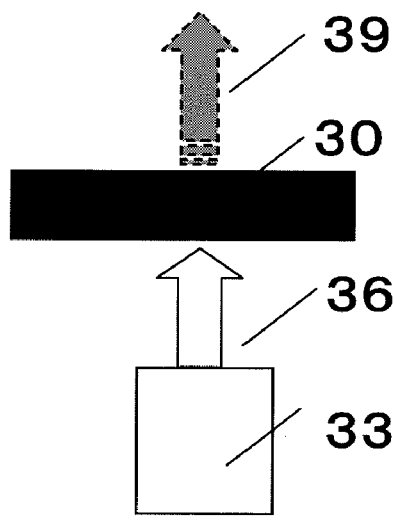
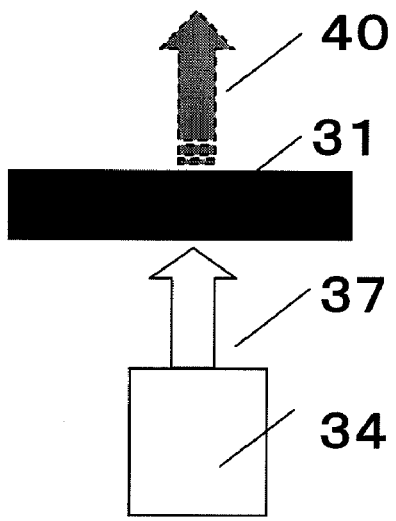

INSPECTION METHOD AND INSPECTION DEVICE, REPAIRING METHOD AND REPAIRING DEVICE FOR ORGANIC ELECTROLUMINESCENCE PANEL

BACKGROUND ART

1. Field of the Invention

The present invention relates to inspection method and an inspection device, repairing method and a repairing device for an organic electroluminescence (EL) panel having processes for inspecting an organic EL element or a pixel of an organic EL panel made of the organic EL element.

2. Description of the Related Art

In recent years, an organic EL panel made of organic EL elements having characteristics, such as a low-voltage driving function, spontaneous light emission, and a high-speed response, has been used as a display device.

As shown in FIG. 14, the organic EL element has a structure in which an anode 100 placed on a glass substrate 400, a cathode 200 placed so as to face the anode 100, and an organic EL layer 300 sandwiched between the anode 100 and the cathode 200. Moreover, a color filter 500 is used in some cases so as to improve a color developing property as a display.

The gap between the anode 100 and the cathode 200 is about 1 μm, which forms a very fine structure. Consequently, during manufacturing processes of an organic EL display device, a portion having an inhomogeneous film thickness in the organic EL layer 300 tends to occur due to inhomogeneousness in the thickness of the metal electrodes or a foreign matter 399 mingled between the electrodes. Since a portion having a thin film thickness in the organic EL layer 300 has low electric resistance, the holes 110 and the electrons 210 are positively supplied thereto to cause a leakage current, with the result that the light emission of the organic EL layer 300 becomes non-uniform to cause an inhomogeneously emitting pixel.

Moreover, in the case where the anode 100 and the cathode 200 completely conduct to each other due to, for example, a large foreign matter mingled therein, since no combinations occur between the holes 110 and the electrons 210, no light emission is generated in the organic EL layer 300 to cause a non-lighting pixel (hereinafter, referred to as a "dark point"). In the case where there are many non-uniform light emission pixels and dark points in the display device, since the image quality and display quality deteriorate extremely, satisfactory products cannot be delivered.

For this reason, it is necessary to detect the non-uniform light emission pixels and dark points by inspection and to repair these. As the repairing method, for example, methods have been proposed in which weak leakage light, generated upon application of a reverse bias voltage to the organic EL device, is detected so that the metal electrodes on the periphery thereof are burned and cut off.

Referring to FIGS. 15A, 15B, and 15C, the following description will discuss a detecting process in which such weak leakage light is detected through color filters. FIG. 15 is an explanatory view showing a state of a leakage light emission of an organic EL panel with color filters of red, green and blue (pixel portions of red, green and blue are shown in this order from the left) are installed therein.

In FIG. 15, when explained by exemplifying a red filter pixel, upon applying a reverse bias voltage to the anode 101 and the cathode 201 on the glass substrate 401 by a power supply 901, a leakage light emission 701 is generated from a current leakage generation portion 601, and a leakage light emission 801 passed through a red color filter 501 is detected by a weak light detection camera 1000 through a lens 1100.

FIG. 16 shows an example of a state of leakage light that has passed through a color filter.

The following explanation relating to FIG. 16 is given on the assumption that the structure shown in FIG. 15 is used, and in this state, it is supposed that a leakage light emission (red filter pixel) 701, a leakage light emission (green filter pixel) 702, and a leakage light emission (blue filter pixel) 703, shown in FIG. 15, have completely the same spectrum and completely the same intensity, and that the red color filter 501, the green color filter 502, and the blue color filter 503 have the same transmittance in the infrared wavelength region, with the transmittances in the visible region being reduced in the order of the red color filter 501, the green color filter 502, and the blue color filter 503.

In this case, the total amounts of light emission become smaller in the order of leakage light emission (visible to infrared wavelength regions) 804 passed through the red color filter 501, leakage light emission (visible to infrared wavelength regions) 805 passed through the green color filter 502, and leakage light emission (visible to infrared wavelength regions) 806 passed through the blue color filter 503; however, an amount of leakage light emission 807 passed through the red color filter 501 (infrared wavelength region), an amount of leakage light emission 808 passed through the green color filter 502 (infrared wavelength region), and an amount of leakage light emission 809 passed through the blue color filter 503 (infrared wavelength region) have the same quantity of light. Here, the rates of the amounts in which infrared components are contained in the leakage light 801 passed through the red color filter 501, the leakage light 802 passed through the green color filter 502, and the leakage light 803 passed through the blue color filter 503 become relatively different from one another.

Consequently, in the case where the lens 1100 in FIG. 15 has such a specification as to cause deviations in focal points between the visible and near-infrared regions, even if distances from the weak light detection camera 1000 to a current leakage generation position (red filter pixel) 601, a current leakage generation position (green filter pixel) 602, and a current leakage generation position (blue filter pixel) 603 are all the same, the focal point positions become different among the leakage light 801 passed through the red color filter 501, the leakage light 802 passed through the green color filter 502 and the leakage light 803 passed through the blue color filter 503.

However, in the above-mentioned conventional technique, since light transmitting characteristics are different depending on the red color filter, green color filter and blue color filter, the intensities and focal points differ depending on the types of color filters, with the result that it becomes difficult to carry out a high-speed inspecting operation at one time, and it is also difficult to determine references of the area and intensity for each of the types of color filters.

SUMMARY OF THE INVENTION

The present invention has been devised to solve the above-mentioned problems, and an object thereof is to provide an inspection method and an inspection device for an organic EL panel that make it possible to detect a leakage light emission at high-speeds with high precision even in the case of an organic EL panel with color filters.

To achieve the above object, in accordance with a first aspect of the present invention, an inspection method for an organic EL panel includes the steps of: applying a predetermined voltage to each of pixels of color filters of respective types relative to an organic EL panel on which the color filters of the respective types are installed; with respect to leakage light generated from the organic EL panel, detecting the leakage light transmitted from each of the color filters of the respective types; adjusting each of the amounts of light emissions of the leakage light detected from the color filters of the respective types so as to be set within reference permissible values for each of the color filters of all the types; and based upon the amount of light emission of each of the leakage light detected from the color filters of the respective types of the organic EL panel, inspecting the organic EL panel.

In the inspection method for an organic EL panel in accordance with a second aspect of the present invention, in addition to the configuration of the first aspect, in the adjusting step, by individually setting a predetermined voltage to be applied to each of the color filters of the respective types, each of the amounts of light emissions of the leakage light is controlled so as to be set within the reference permissible values for each of the color filters of all the types.

In the inspection method for an organic EL panel in accordance with a third aspect of the present invention, in addition to the configuration of the first or second aspect, in the step of detecting the leakage light transmitted from each of the color filters of the respective types, by picking up an image of the organic EL panel by using an image pickup element, the detection of the leakage light is carried out, and upon picking up the image, by individually setting a positional relationship between the organic EL panel and the image pickup element for each of the color filters of the respective types, the transmitted leakage light is detected for each of the color filters of the respective types.

In the inspection method for an organic EL panel in accordance with a fourth aspect of the present invention, in addition to the configuration of the third aspect, in the detecting step, upon detecting the leakage light by picking up an image of the organic EL panel by the image pickup element, since the leakage light, transmitted through each of the color filters of the respective types, contains infrared-ray wavelength components, by preliminarily finding a reference leakage light emission focal point position, an adjusting step is carried out to a focal point position that makes the relative distance from the leakage light emission focal point for each of the color filters of the respective types to the reference leakage light emission focal point position shortest.

In accordance with a fifth aspect of the present invention, a repairing method for an organic EL panel includes: the respective steps of the inspection method for an organic EL panel according to any one of first to fourth aspects; and the step of repairing the organic EL panel based upon the inspection results of the inspection step.

In accordance with a sixth aspect of the present invention, a inspection device for an organic EL panel includes: individual voltage applying unit operable to individually apply a predetermined voltage to each of pixels of color filters of respective types relative to an organic EL panel on which the color filters of the respective types are installed; leakage light detection unit operable to detect the leakage light transmitted from each of the color filters of the respective types, with respect to leakage light generated from the organic EL panel; control unit operable to adjust each of the amounts of light emissions of the leakage light transmitted through the color filters of the respective types so as to be set within reference permissible values for each of the color filters of all the types, by setting an applying voltage value to be individually given to each of the color filters by the individual voltage applying unit; and inspection unit operable to inspect the organic EL panel based upon the amount of light emission of each of the leakage light detected from the color filters of the respective types of the organic EL panel.

In the inspection device for an organic EL panel in accordance with a seventh aspect of the present invention, in addition to the configuration of the sixth aspect, the control unit individually sets an applying voltage value to be applied to each of the color filters of the respective types by the individual voltage applying unit so that each of the amounts of light emissions of the leakage light is controlled so as to be set within the reference permissible values for each of the color filters of all the types.

In the inspection device for an organic EL panel in accordance with an eighth aspect of the present invention, in addition to the configuration of the sixth or seventh aspect, the leakage light detection unit detects the leakage light by picking up an image by using an image pickup element for each of the color filters of the respective types and further includes focal point adjusting unit operable to individually set a positional relationship between the organic EL panel and the image pickup element.

In accordance with a ninth aspect of the present invention, in addition to the configuration of any one of the sixth to eighth aspects, the inspection device for an organic EL panel further includes: a plurality of filter unit, each having a transmitting wavelength region equivalent to that of a color filter possessed by the organic EL panel; and a plurality of light-emitting unit that are placed in association with the filter unit, and exert a light-emission state different from a defective leakage light emission.

In accordance with a tenth aspect of the present invention, a repairing device for an organic EL panel includes: the respective units of the inspection device for an organic EL panel according to any one of the sixth to ninth aspects; and repairing unit operable to repair the organic EL panel based upon the inspection results of the inspection unit.

In accordance with the present invention, even in the case of an organic EL panel with color filters, it becomes possible to detect a defect in the organic EL panel at high-speeds with high precision by detecting a leakage light emission while correcting differences in the intensity and focal point for each of the types of filters.

BRIEF DESCRIPTION OF THE DRAWINGS

FIG. 12 is an explanatory view showing an essential portion in the inspection device for the organic EL panel in accordance with the fourth embodiment;

DESCRIPTION OF THE PREFERRED EMBODIMENT

Figure 1:
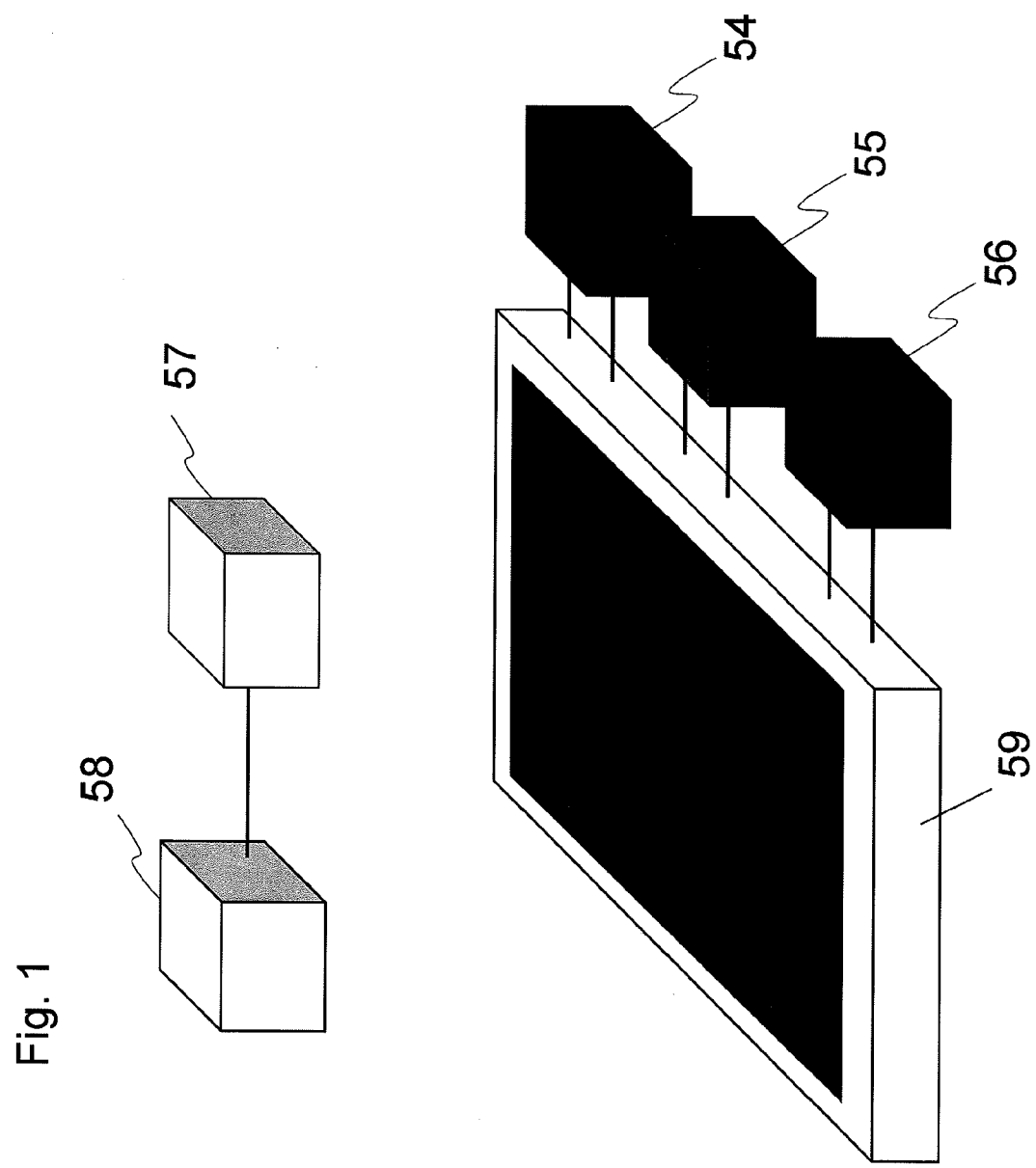
FIG. 1 is a structural view showing an inspection device for an organic EL panel in accordance with a first embodiment.

Referring to the drawings, the following description will discuss an inspection method and an inspection device for an organic EL panel, as well as a repairing method and a repairing device for an organic EL panel, in accordance with embodiments of the present invention. It is noted that the same components are indicated by the same reference numerals, and the description thereof is not given here.

First Embodiment

Figure 15:
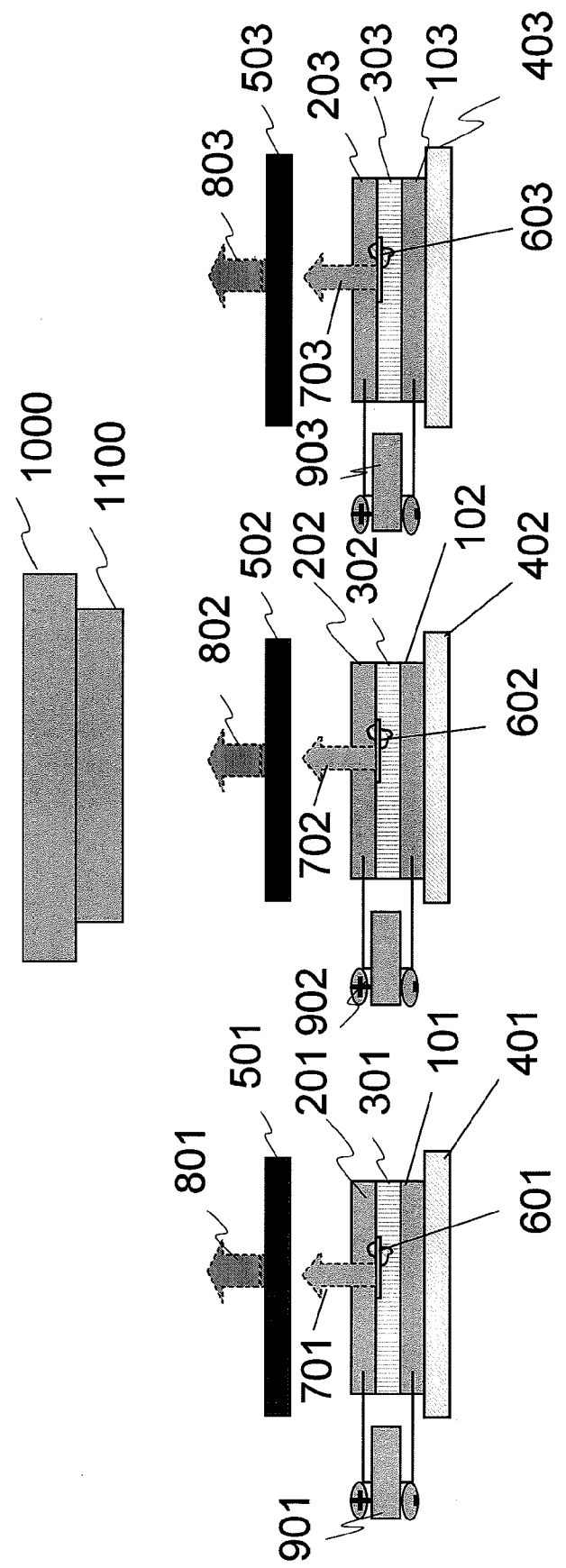
FIG. 15 is an explanatory view showing an example of a state of a leakage light emission of an organic EL panel with color filters.

FIG. 1 is a structural view showing an inspection device for an organic EL panel in accordance with a first embodiment of the present invention. The present embodiment basically exemplifies an organic EL panel in which color filters of red, green and blue are installed, as shown in FIG. 15. In FIG. 1, reference numeral 54 represents a red filter-unit individual voltage value setting unit, 55 represents a green filter-unit individual voltage value setting unit, 56 represents a blue filter-unit individual voltage value setting unit, 57 represents an image pickup unit, 58 represents a leakage image detection unit, and 59 represents an organic EL display panel (organic EL panel) with color filters. Here, each of 54, 55 and 56 functions as individual voltage applying unit, and 57 serves as image-pickup unit.

In the inspection processes of the first embodiment, first, the red filter-unit individual voltage value setting unit 54, the green filter-unit individual voltage value setting unit 55 and the blue filter-unit individual voltage value setting unit 56 are electrically connected to electrodes of the organic EL display panel 59 with color filters. Next, individual voltages are respectively applied to the red filter unit, the green filter unit and the blue filter unit of the organic EL display panel 59 with color filters by the red filter-unit individual voltage value setting unit 54, the green filter-unit individual voltage value setting unit 55, and the blue filter-unit individual voltage value setting unit 56.

In this stage, by applying a predetermined voltage, for example, a reverse bias voltage, to the organic EL panel, leakage light is generated when the organic EL layer has any defect. Here, the individual application voltage value for each color filter is set so that the amount of reference leakage light emission for each of the types of color filters is set within reference permissible values in each of all the types of color filters.

Next, an image of leakage light is picked up by the image pickup unit 57. Then, a defective leakage is detected according to the image of leakage light by the leakage image detection unit 58. The final determination of the detective leakage may be carried out by visual inspection on a displayed image on a display or the like, or may be automatically determined by an image-processing apparatus.

In this embodiment, the red filter-unit individual voltage value setting unit 54, the green filter-unit individual voltage value setting unit 55 and the blue filter-unit individual voltage value setting unit 56 are installed individually; however, these may be combined with one another into a one unit.

Figure 2:
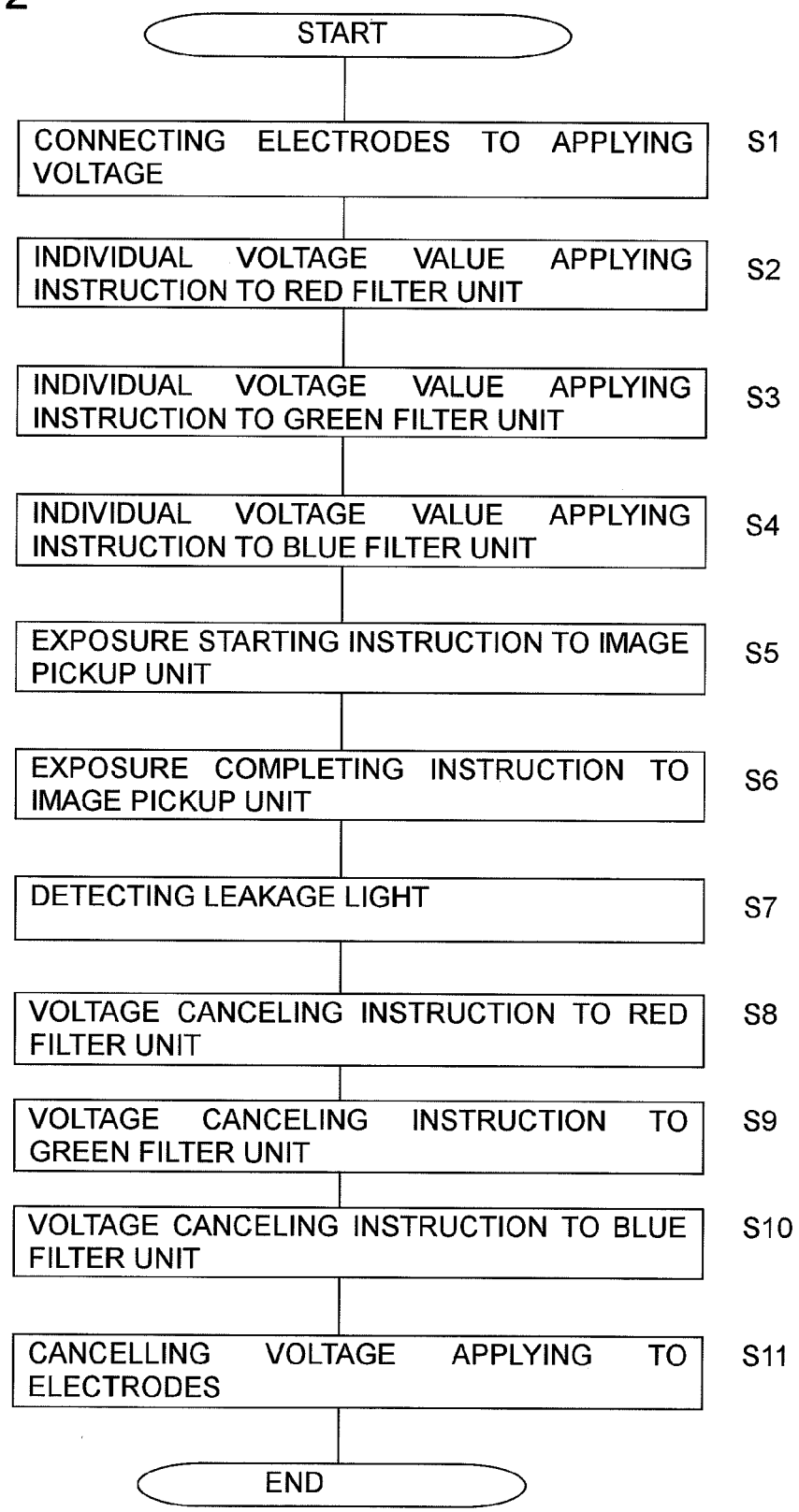
FIG. 2 is a flow chart showing inspection processes of an inspection method for the organic EL panel in accordance with the first embodiment.

FIG. 2 is a flow chart showing inspection processes of an organic EL panel inspection method to be carried out by control unit in accordance with the first embodiment. In FIG. 2, S1 represents a step of connecting a voltage-applying electrode, S2 represents a step of instructing an application of a red filter-unit individual voltage value; S3 represents a step of instructing an application of a green filter-unit individual voltage value; S4 represents a step of instructing an application of a blue filter-unit individual voltage value; S5 represents a step of instructing a start of exposure to the image pickup unit 57; S6 represents a step of instructing completion of exposure to the image pickup unit; S7 represents a step of detecting leakage light; S8 represents a step of instructing cancellation of the red filter-unit voltage; S9 represents a step of instructing cancellation of the green filter-unit voltage; S10 represents a step of instructing cancellation of the blue filter-unit voltage; and S11 represents a step of canceling the voltage-applying electrode.

In the first embodiment, first, in order to apply a voltage to the organic EL panel, a voltage-applying power supply is connected to the electrodes in step S1 for voltage-applying electrode connection. Next, an individual voltage value for the red filter is applied to the red filter unit in step S2 of the instruction for an application of a red filter-unit individual voltage value, an individual voltage value for the green filter is applied to the green filter unit in step S3 of the instruction for an application of a green filter-unit individual voltage value, and an individual voltage value for the blue filter is applied to the blue filter unit in step S4 of the instruction for an application of a blue filter-unit individual voltage value. In the first embodiment, the steps are divided depending on red, green and blue colors, and the flow is executed in the order of red, green and blue; however, the order may be changed within this range, and voltages may be applied simultaneously.

In this stage, by applying a predetermined voltage, for example, a reverse bias voltage, to the organic EL panel, leakage light is generated in the case where there is any defect in the organic EL layer. Next, an exposing process in the image pickup unit 57 is started in step S5 for instructing the start of exposure to the image pickup unit 57, and the exposing process in the image pickup unit 57 is completed in step S6 for instructing the completion of exposure to the image pickup unit 57. In these steps S5 and S6, an image pickup process of a leakage light image is carried out.

Next, a detecting process of the leakage light is carried out in step S7 for leakage light detection. In this case, the detection may be carried out by a visual determination or may be carried out by an automatic determination by the use of image processing.

Moreover, step S7 for leakage light detection may be carried out in any order as long as it is executed after step S6 for instructing the completion of exposure to the image pickup unit 57. Then, step S8 for instructing the cancellation of the red filter-unit voltage, step S9 for instructing the cancellation of the green filter-unit voltage, and step S10 for instructing the cancellation of the blue filter-unit voltage are carried out so that the voltage application to the organic EL panel is cancelled.

In the first embodiment, the steps are divided depending on red, green and blue colors, and the flow is executed in the order of red, green and blue; however, the order may be changed within this range, and voltages may be cancelled simultaneously. Then, in step S11 for canceling the voltage application electrode, the connection between the electrode and the applying power supply is cancelled.

Figure 16:
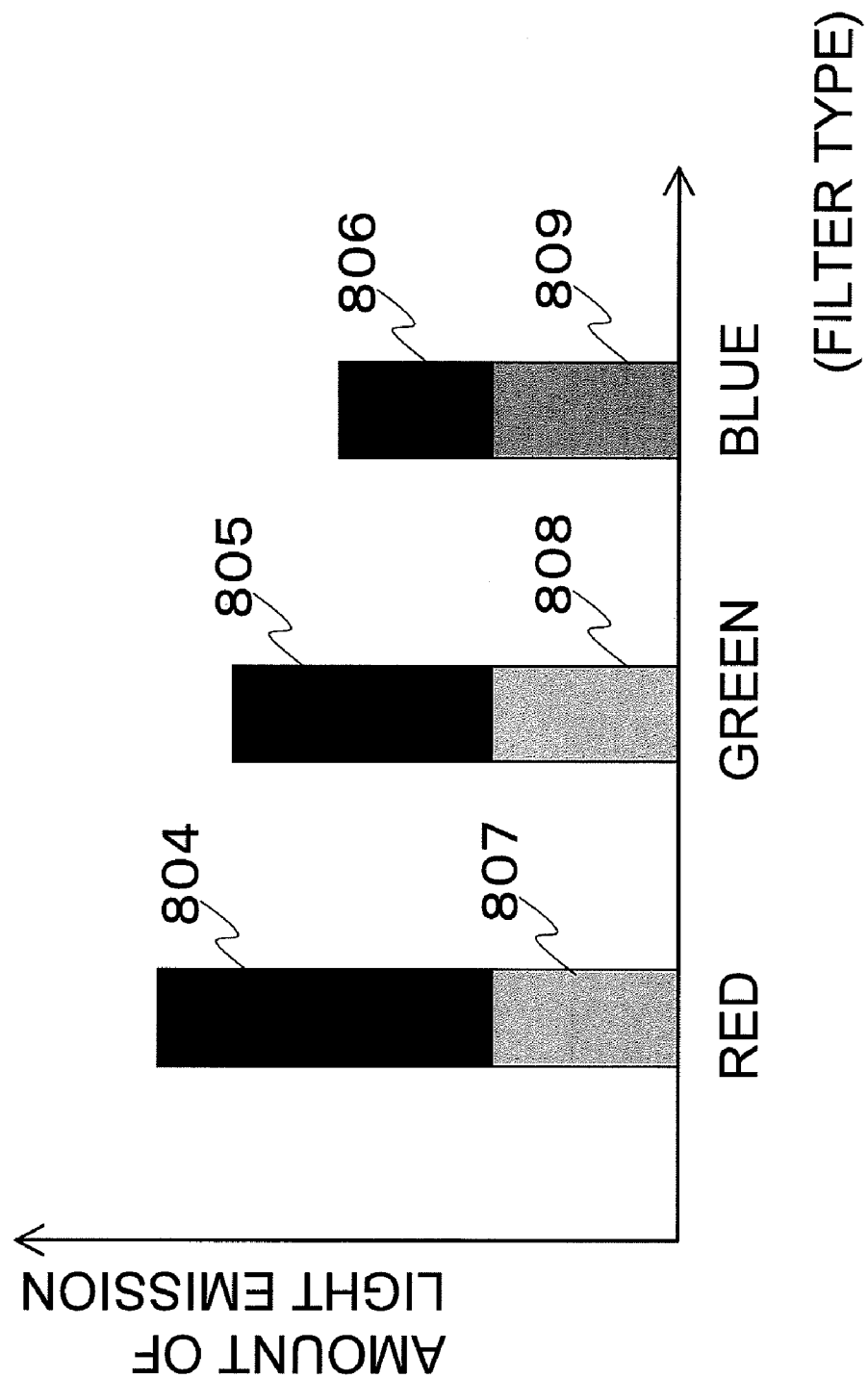
FIG. 16 is an explanatory view showing an example of a state of leakage light that has passed through a color filter.

Referring to FIG. 15 and FIG. 16, the following description will discuss settings of applied voltage values in step S2 of instructing an application of a red filter-unit individual voltage value, step S3 of instructing an application of a green filter-unit individual voltage value and step S4 of instructing an application of a blue filter-unit individual voltage value.

In FIG. 15, as described earlier, for example, in the case of a red filter pixel (pixel having a red filter), upon application of a reverse bias voltage to an anode 101 and a cathode 201 on a glass substrate 401 by using a power supply 901, a leakage light emission 701 is generated from a current leakage generation position 601 so that a leakage light emission 801 passed through a red color filter 501 is observed.

In this case, suppose that the anode (anode in the pixel having a red filter) 101, an anode (green filter pixel) 102, and an anode (blue filter pixel) 103 are the same, that the cathode (red filter pixel) 201, a cathode (green filter pixel) 202, and a cathode (blue filter pixel) 203 are the same, that an organic EL layer (red filter pixel) 301, an organic EL layer (green filter pixel) 302, and an organic EL layer (blue filter pixel) 303 are the same, and that a glass substrate (red filter pixel) 401, a glass substrate (green filter pixel) 402, and a glass substrate (blue filter pixel) 403 are the same.

Moreover, supposing that, upon application of the same reverse bias voltage by a power supply (red filter pixel) 901, a power supply (green filter pixel) 902, and a power supply (blue filter pixel) 903, the areas and intensities of the leakage light emission (red filter pixel) 701, a leakage light emission (green filter pixel) 702, and a leakage light emission (blue filter pixel) 703 respectively generated from the current leakage generation position (red filter pixel) 601, a current leakage generation position (green filter pixel) 602, and a current leakage generation position (blue filter pixel) 603 are all the same, and that the transmittances of the visible regions become smaller in the order of the red color filter 501, the green color filter 502 and the blue color filter 503, the total amounts of leakage light emission (visible to infrared wavelength regions) 804 passed through the red color filter 501, leakage light emission (visible to infrared wavelength regions) 805 passed through the green color filter 502, and leakage light emission (visible to infrared wavelength regions) 806 passed through the blue color filter 503 become smaller in this order.

With respect to the settings of applied voltage values in step S2 of instructing an application of a red filter-unit individual voltage value, step S3 of instructing an application of a green filter-unit individual voltage value and step S4 of instructing an application of a blue filter-unit individual voltage value of FIG. 2, by utilizing the above-mentioned fact that the leakage light intensity changes depending on the applied voltage as characteristics of the leakage light emission (red filter pixel) 701, leakage light emission (green filter pixel) 702, and leakage light emission (blue filter pixel) 703, those settings are carried out depending on the amount of leakage light emission (visible to infrared wavelength regions) 804 passed through the red color filter 501, the amount of leakage light emission (visible to infrared wavelength regions) 805 passed through the green color filter 502 and the amount of leakage light emission (visible to infrared wavelength regions) 806 passed through the blue color filter 503.

With respect to the specific change in leakage light intensity due to the applied voltage, in the case of the reverse bias voltage application, the leakage light intensity becomes stronger as the applied voltage becomes higher. Therefore, in the case of FIG. 16, in the order of blue>green>red, the voltage of blue can be set to the highest, and the voltage of red can be set to the lowest.

As described above, by adjusting the voltage values so that the amount of leakage light emission (visible to infrared wavelength regions) 804 passed through the red color filter 501, the amount of leakage light emission (visible to infrared wavelength regions) 805 passed through the green color filter 502, and the amount of leakage light emission (visible to infrared wavelength regions) 806 passed through the blue color filter 503 are made equivalent to one another, it becomes possible to carry out detections of leakage light by picking up images of red, green and blue at one time.

Additionally, with respect to the determination of equalization of the amount of leakage light emission 806, by determining the intensities of the amount of leakage light emission (visible to infrared wavelength regions) 804 passed through the red color filter 501, the amount of leakage light emission (visible to infrared wavelength regions) 805 passed through the green color filter 502, and the amount of leakage light emission (visible to infrared wavelength regions) 806 passed through the blue color filter 503, each serving as a reference, upon picking up images of leakage light so that all the intensities are set within reference permissible values.

More specifically, referring to FIGS. 3A to 3G, the following description will discuss what changes are made by the intensities of the amount of leakage light emission (visible to infrared wavelength regions) 804 passed through the red color filter 501, the amount of leakage light emission (visible to infrared wavelength regions) 805 passed through the green color filter 502 and the amount of leakage light emission (visible to infrared wavelength regions) 806 passed through the blue color filter 503.

Figure 3:
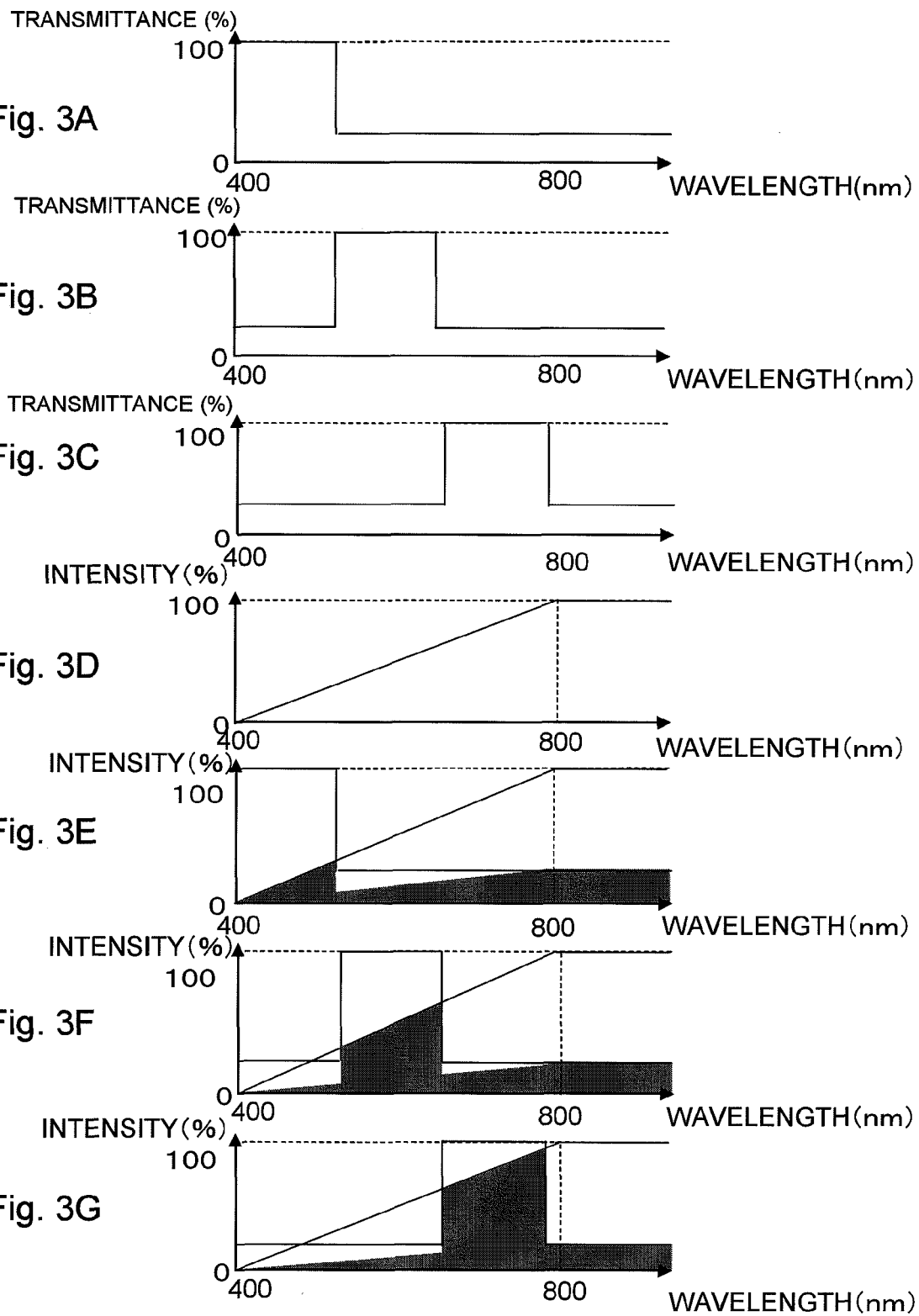
FIGS. 3A to 3G are explanatory diagram each showing a change in leakage light due to a color filter in accordance with the first embodiment.

FIGS. 3A to 3G are diagrams each showing a change in leakage light caused by the color filter, and FIG. 3A shows an example of a transmission characteristic of a blue color filter, FIG. 3B shows an example of a transmission characteristic of a green color filter, FIG. 3C shows an example of a transmission characteristic of a red color filter, FIG. 3D shows an example of a spectral characteristic of leakage light, FIG. 3E shows a spectral characteristic of leakage light that has transmitted through a color filter having the characteristic of FIG. 3A, FIG. 3F shows a spectral characteristic of leakage light that has transmitted through the green color filter having the characteristic of FIG. 3B, and FIG. 3G shows a spectral characteristic of leakage light that has transmitted through the red color filter having the characteristic of FIG. 3C.

Here, FIGS. 3A to 3G schematically show the characteristic in a linear manner for easiness of concept explanation. Moreover, the axis of ordinate of FIGS. 3A, 3B, and 3C represents the transmission characteristic (transmittance), with 100% being set as the maximum value, the axis of ordinate of FIG. 3D represents the intensity, with 100% being set as the maximum value, and the axis of ordinate of each of FIGS. 3E, 3F and 3G represents the intensity, with the maximum value of the leakage light intensity of FIG. 3D being set to 100%.

Moreover, FIG. 3E also shows the characteristic of FIG. 3A and the leakage light intensity of FIG. 3D, and the spectral characteristic of leakage light that has transmitted through a color filter having the characteristic of FIG. 3A is indicated by a hatched portion. The equation, [transmittance of FIG. 3A]× [leakage light intensity of FIG. 3D]=[leakage light intensity of FIG. 3E], is applied to each of the wavelengths. In the same manner, FIG. 3F also shows the characteristic of FIG. 3B and the leakage light intensity of FIG. 3D, and the spectral characteristic of leakage light that has transmitted through a color filter having the characteristic of FIG. 3B is indicated by a hatched portion. The equation, [transmittance of FIG. 3B]× [leakage light intensity of FIG. 3D]=[leakage light intensity of FIG. 3F], is applied to each of the wavelengths, and in the same manner, FIG. 3G also shows the characteristic of FIG. 3C and the leakage light intensity of FIG. 3D, and the spectral characteristic of leakage light that has transmitted through a color filter having the characteristic of FIG. 3C is indicated by a hatched portion. The equation, [transmittance of FIG. 3C]× [leakage light intensity of FIG. 3D]=[leakage light intensity of FIG. 3G], is applied to each of the wavelengths.

In this manner, as shown in FIG. 16, depending on the transmission characteristic (transmittance) of the color filter and the spectral characteristic of the leakage light, the intensities of the amount of leakage light emission (visible to infrared wavelength regions) 804 passed through the red color filter 501, the amount of leakage light emission (visible to infrared wavelength regions) 805 passed through the green color filter 502, and the amount of leakage light emission (visible to infrared wavelength regions) 806 passed through the blue color filter 503 are varied.

In the case of an image-pickup system capable of acquiring the light emission intensity of 100% in all the wavelengths, the value of the hatched portion area of FIG. 3E corresponds to the intensity of the amount of leakage light emission (visible to infrared wavelength regions) 806 passed through the blue color filter 503, the value of the hatched portion area of FIG. 3F corresponds to the intensity of the amount of leakage light emission (visible to infrared wavelength regions) 805 passed through the green color filter 502, and the value of the hatched portion area of FIG. 3G corresponds to the intensity of the amount of leakage light emission (visible to infrared wavelength regions) 804 passed through the red color filter 501.

The first embodiment has exemplified color filters of red, green and blue; however, the color filters are not necessarily required to be red, green and blue, as long as a plurality of color filters are prepared. Moreover, depending on the characteristic of a color filter and the characteristic of an organic EL element serving as a base, the voltage of blue is not necessarily set to the highest, and the voltage of red is not necessarily set to the lowest, and the present invention is not intended to be limited by these.

Although the characteristic is schematically indicated linearly in FIGS. 3A to 3G for easiness of explanation, the characteristic is not linearly varied actually, and, for example, in the case of color filters, situations are different depending on their specific commodities.

For example, with respect to the specific examples of transmission characteristics of the red color filter 501, the green color filter 502 and the blue color filter 503, when the color filters for liquid crystal are compared at the maximum wavelength of 700 nm, the transmittance is greater in B (blue color filter) than in G (green color filter) in one case, the transmittance is greater in G (green color filter) than in B (blue color filter) in another case. In each of the cases, at 700 nm, the transmittance is greater in R (red color filter) than in G (green color filter) and B (blue color filter). In this manner, the settings need to be made depending on the transmittance of the color filter. Moreover, the image-pickup system is not necessarily allowed to acquire 100% light emission intensity in all the wavelengths, and since the quantum effect differs depending on the wavelengths, the settings need to be made on demand.

After inspections have been carried out (inspection processes by inspecting unit) as described above, the organic EL panel is repaired by carrying out required repair (repairing process by repairing unit) based upon the results of inspections. For example, in the case where, as the results of inspections, it is found that there is a pixel defect in such a degree as not to impair the display function of the organic EL panel, the organic EL panel can be repaired by preventing the organic EL panel pixel from being operated (functioning). Moreover, needless to say, the repairing process by the repairing unit also includes refrairing from carrying out a repair upon determination of the unnecessity of repair.

Second Embodiment

Figure 4:
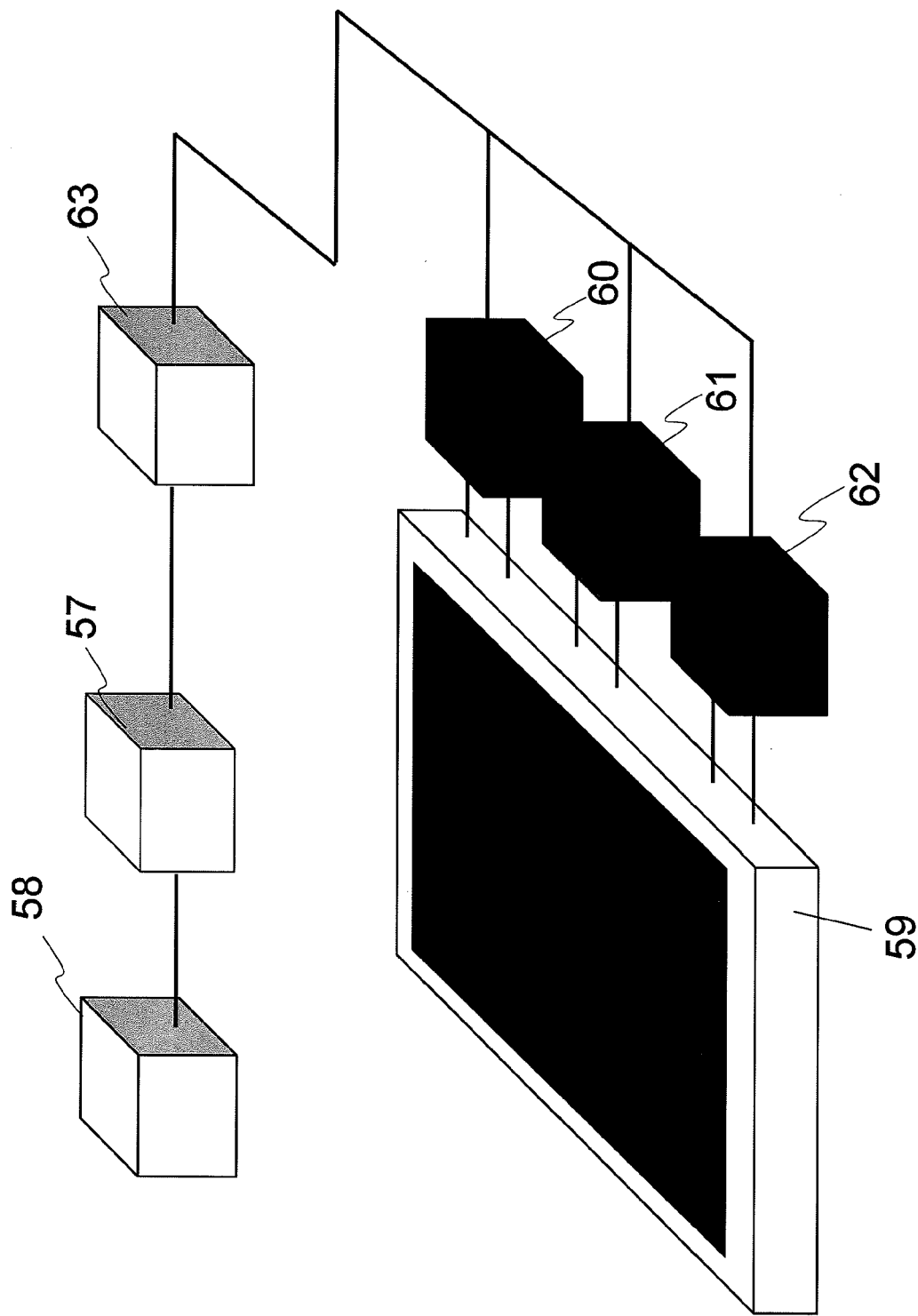
FIG. 4 is a structural view showing an inspection device for an organic EL panel in accordance with a second embodiment.

FIG. 4 is a structural view showing an inspection device for an organic EL panel in accordance with a second embodiment of the present invention. In FIG. 4, reference numeral 60 represents a red filter-unit voltage setting unit, 61 represents a green filter-unit voltage setting unit, 62 represents a blue filter-unit voltage setting unit, and 63 represents a controller unit.

In the inspection processes of the second embodiment, first, the red filter-unit voltage setting unit 60, the green filter-unit voltage setting unit 61 and the blue filter-unit voltage setting unit 62 are electrically connected to electrodes of the organic EL display panel 59 with color filters. Next, voltages are respectively applied to the red filter unit, the green filter unit, and the blue filter unit of the organic EL display panel 59 with color filters by the red filter-unit voltage setting unit 60, the green filter-unit voltage setting unit 61 and the blue filter-unit voltage setting unit 62. In this stage, by applying a predetermined voltage, for example, a reverse bias voltage, to the organic EL panel, leakage light is generated when the organic EL layer has any defect.

Next, the controller unit 63 gives an instruction for starting exposure to the image pickup unit 57 in order to pick up an image of the leakage light. Thereafter, the controller unit 63 successively gives an instruction for canceling the voltage application to the red filter-unit voltage setting unit 60, the green filter-unit voltage setting unit 61, and the blue filter-unit voltage setting unit 62 in this order so that the voltage application is cancelled. Then, the controller unit 63 gives an instruction for completing the exposure to the image pickup unit 57. In this manner, the leakage light image acquiring process is completed.

In this case, it is necessary to set the individual voltage applying time for each color filter, such that the accumulated amount of light, calculated by a product of the amount of reference leakage light emission for each of the types of color filters and the voltage applying time for each of the types of color filters are maintained within reference permissible values in each of all the types. Thus, the controller unit 63 controls the amounts of reference leakage light emissions, such that the amounts of reference leakage light emissions are made equivalent to one another on the picked-up image for all the types. Then, a defective leakage is detected by the leakage image detection unit 58. The detection of the detective leakage may be carried out by visual inspection on a displayed image on a display or the like, or may be automatically determined by an image-processing apparatus.

Figure 5:
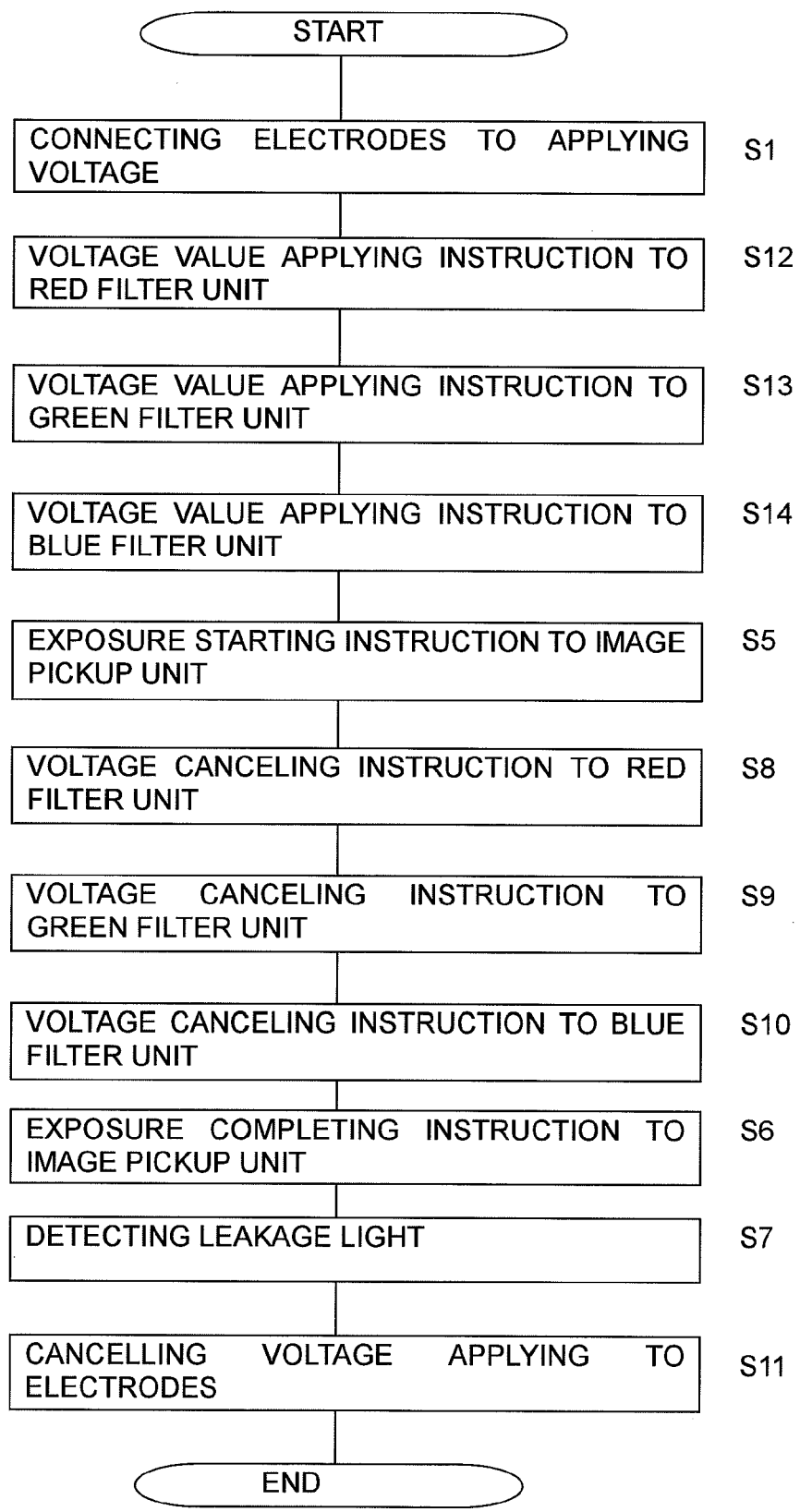
FIG. 5 is a flow chart showing inspection processes of an inspection method for the organic EL panel in accordance with the second embodiment.

FIG. 5 is a flow chart showing inspection processes of an organic EL panel inspection method in accordance with the second embodiment. In FIG. 5, those components that are the same as those of FIG. 2 are indicated by the same reference numerals, and the description thereof is not given here.

FIG. 5, for example, shows an organic EL panel provided with red, green and blue color filters. In FIG. 5, S12 represents a step of instructing an application of a red filter-unit voltage; S13 represents a step of instructing an application of a green filter-unit voltage, and S14 represents a step of instructing an application of a blue filter-unit voltage.

In FIG. 5, first, in order to apply a voltage to the organic EL panel in step S1 of connecting the voltage applying electrode, a voltage-applying power supply is connected to the electrodes. Next, respective voltage values are applied to the organic EL panel in step 12 of the instruction for an application of a red filter-unit voltage, step 13 of the instruction for an application of a green filter-unit voltage and step S14 of the instruction for an application of a blue filter-unit voltage.

In the second embodiment, the steps are divided depending on red, green and blue colors, and the flow is executed in the order of red, green and blue; however, the order may be changed within this range, and voltages may be applied simultaneously.

In this stage, by applying a predetermined voltage, for example, a reverse bias voltage, to the organic EL panel, leakage light is generated in the case where there is any defect in the organic EL layer. Next, an exposing process in the image pickup unit 57 is started in step S5 for instructing the start of exposure to the image pickup unit 57. Then, the voltage supply to the red filter unit is stopped in step S8 for instructing the cancellation of the red filter-unit voltage, the voltage supply to the green filter unit is next stopped in step S9 for instructing the cancellation of the green filter-unit voltage, the voltage supply to the blue filter unit is next stopped in step S10 for instructing the cancellation of the blue filter-unit voltage, and the exposing process in the image pickup unit is completed in step S6 for instructing the completion of exposure to the image pickup unit. In these steps S8, S9, S10 and S6, an image pickup process of a leakage light image is carried out. Timings of these steps S8, S9, S10 and S6 will be described later in detail.

Next, a detecting process of the leakage light is carried out in step S7 for leakage light detection. In this case, the final determination may be carried out by a visual determination or may be carried out by an automatic determination by the use of image processing. Moreover, step S7 for leakage light detection may be carried out in any order as long as it is executed after step S6 for instructing the completion of exposure to the image pickup unit 57. Moreover, the connection between the electrode and the applying power supply is cancelled in step S11 of canceling the voltage-applying power supply.

Referring to FIGS. 6A to 6D, the following description will discuss timings of steps S8, S9, S10 and S6.

Figure 6:
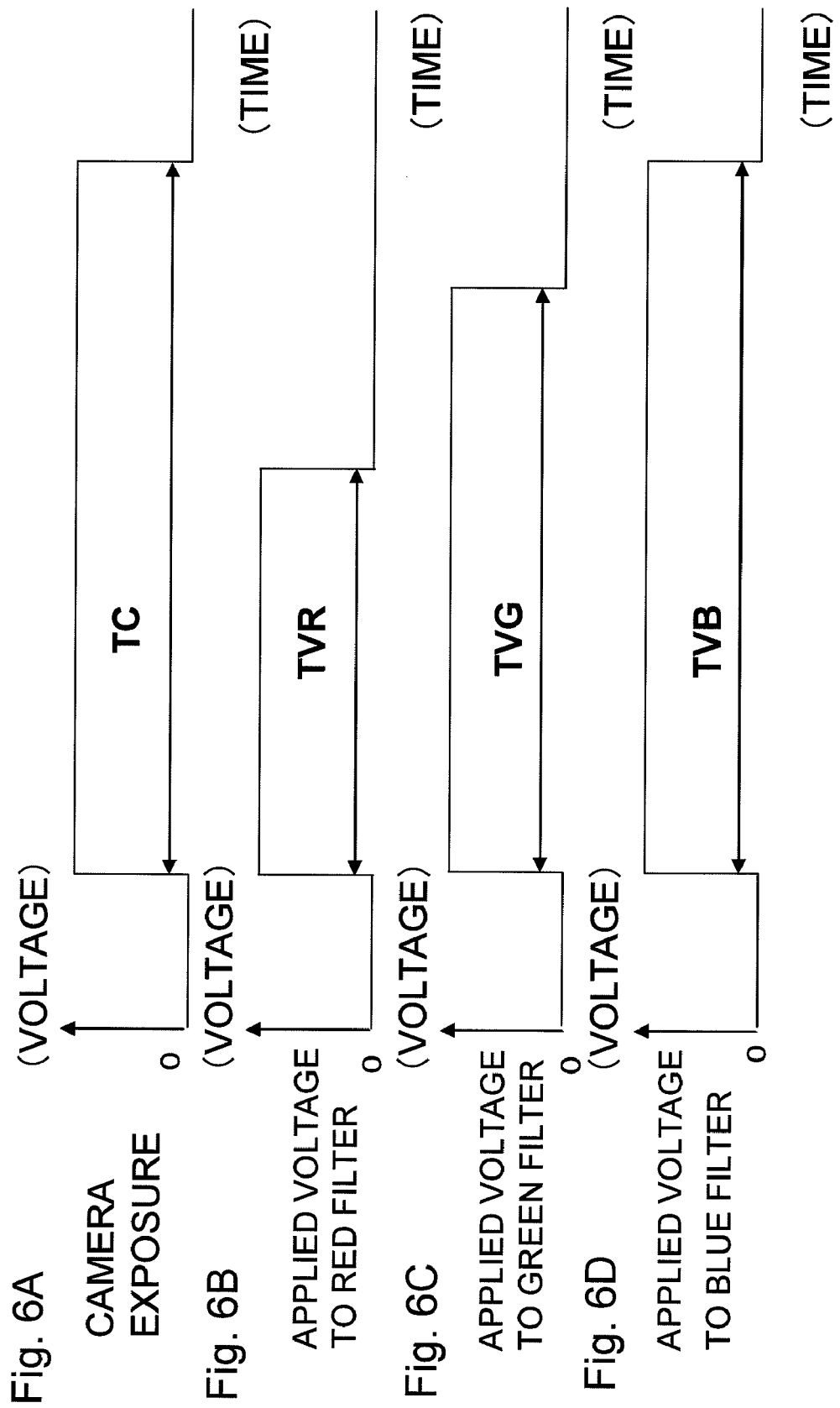
FIGS. 6A to 6D are timing charts between a camera exposure and a voltage application in accordance with the second embodiment.

FIGS. 6A to 6D are timing charts between the camera exposure and voltage application in the second embodiment. FIG. 6A shows a camera exposure, FIG. 6B shows applied voltage to the red filter, FIG. 6C shows applied voltage to the green filter, and FIG. 6D shows applied voltage to the blue filter, respectively. The axis of ordinate represents voltage, and the axis of abscissa represents time. Here, the respective units shown in FIGS. 6A to 6D are supposed to be the same as those shown in FIGS. 15 and 16.

Schematically, in the case where the amount of leakage light emission (visible to infrared wavelength regions) 804 passed through the red color filter 501, the amount of leakage light emission (visible to infrared wavelength regions) 805 passed through the green color filter 502 and the amount of leakage light emission (visible to infrared wavelength regions) 806 passed through the blue color filter 503, shown in FIG. 16, become smaller in the order of red, green and blue, in the order of TVR<TVG<TVB of FIGS. 6B to 6D, TVR can be set to the shortest, and TVB can be set to the longest.

More specifically, the accumulated amount of light, calculated by a product of each of the amount of leakage light emission (visible to infrared wavelength regions) 804 passed through the red color filter, the amount of leakage light emission (visible to infrared wavelength regions) 805 passed through the green color filter, and the amount of leakage light emission (visible to infrared wavelength regions) 806 passed through the blue color filter, and the voltage application time of each of the color filter types, TVR, TVG and TVB shown in FIGS. 6B to 6D, is set within reference permissible values in each of all the types so as to be made equivalent.

The exposure timing (camera exposure TC) may be set so that, immediately after the stop of the voltage supply to the blue filter unit in step S10 for instructing the cancellation of the blue filter-unit voltage, the exposure in the image pickup unit 57 can be completed in step S6 for instructing the completion of exposure to the image pickup unit 57, that is, TC>=TVB can be satisfied (strictly speaking, on the assumption that the leading edge of TC and the leading edge of TVB are coincident with each other). In this manner, by adjusting TVR, TVG, TVB and TC so that the accumulated amount of light, calculated by a product of each of the amount of leakage light emission (visible to infrared wavelength regions) 804 passed through the red color filter, the amount of leakage light emission (visible to infrared wavelength regions) 805 passed through the green color filter and the amount of leakage light emission (visible to infrared wavelength regions) 806 passed through the blue color filter and each of TVR, TVG and TVB, is made equivalent to one another for each of the filters of red, green and blue, it becomes possible to carry out image-pickup processes of red, green and blue, at one time, so as to be detected.

Third Embodiment

Figure 7:
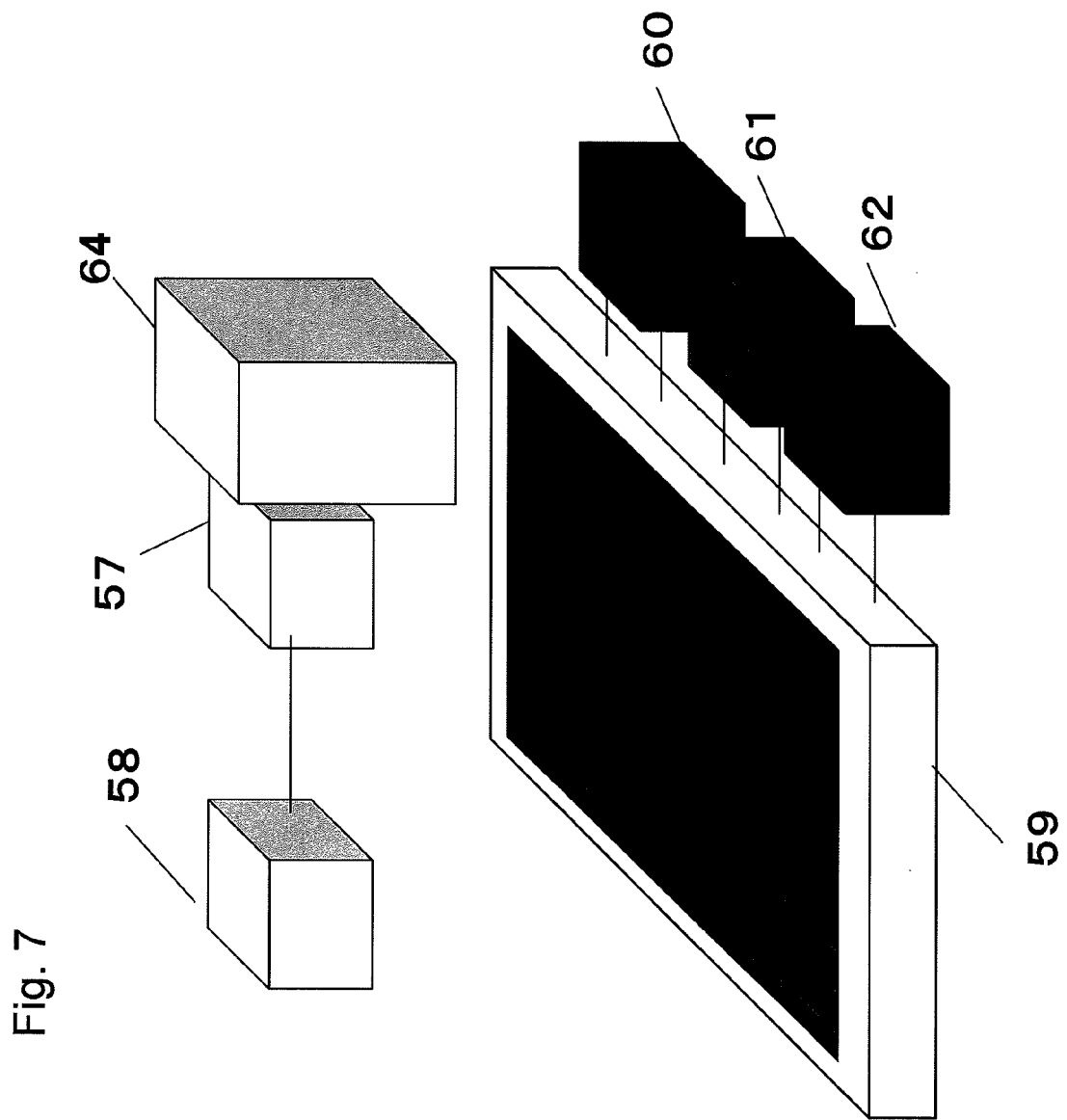
FIG. 7 is a structural view showing an inspection device for an organic EL panel in accordance with a third embodiment.

FIG. 7 is a structural view showing an inspection device for an organic EL panel in accordance with a third embodiment of the present invention, and in FIG. 7, those components that are the same as those of FIGS. 1 and 3A to 3G are indicated by the same reference numerals, and the description thereof is not given here. In FIG. 7, reference numeral 64 represents a focal point adjusting unit.

In the inspection processes of the third embodiment, first, the red filter-unit voltage setting unit 60, the green filter-unit voltage setting unit 61 and the blue filter-unit voltage setting unit 62 are electrically connected to electrodes of the organic EL display panel 59 with color filters. Next, a voltage is applied to the red filter unit of the organic EL display panel 59 with color filters from the red-filter unit voltage setting unit 60. In this stage, by applying a predetermined voltage, for example, a reverse bias voltage, to the organic EL panel, leakage light is generated when the organic EL layer of the red filter unit has any defect.

In the focal point adjusting unit 64, by controlling the image pickup unit 57 or by shifting the organic EL display panel 59, the focal point of the image pickup unit 57 relative to the organic EL display panel 59 with color filters is adjusted. This controlling process may be carried out by shifting the entire image pickup unit 57 or by shifting one portion of the optical system in the image pickup unit 57. Next, an image of the leakage light is picked up by the image pickup unit 57. Then, a defective leakage is detected by the leakage image detection unit 58. The final determination may be carried out by visual inspection on a displayed image on a display or the like, or may be automatically carried out by an image-processing apparatus. Thus, the detection process of the red filter unit is completed, and the same process is carried out on the green filter unit and the blue filter unit.

Figure 8:
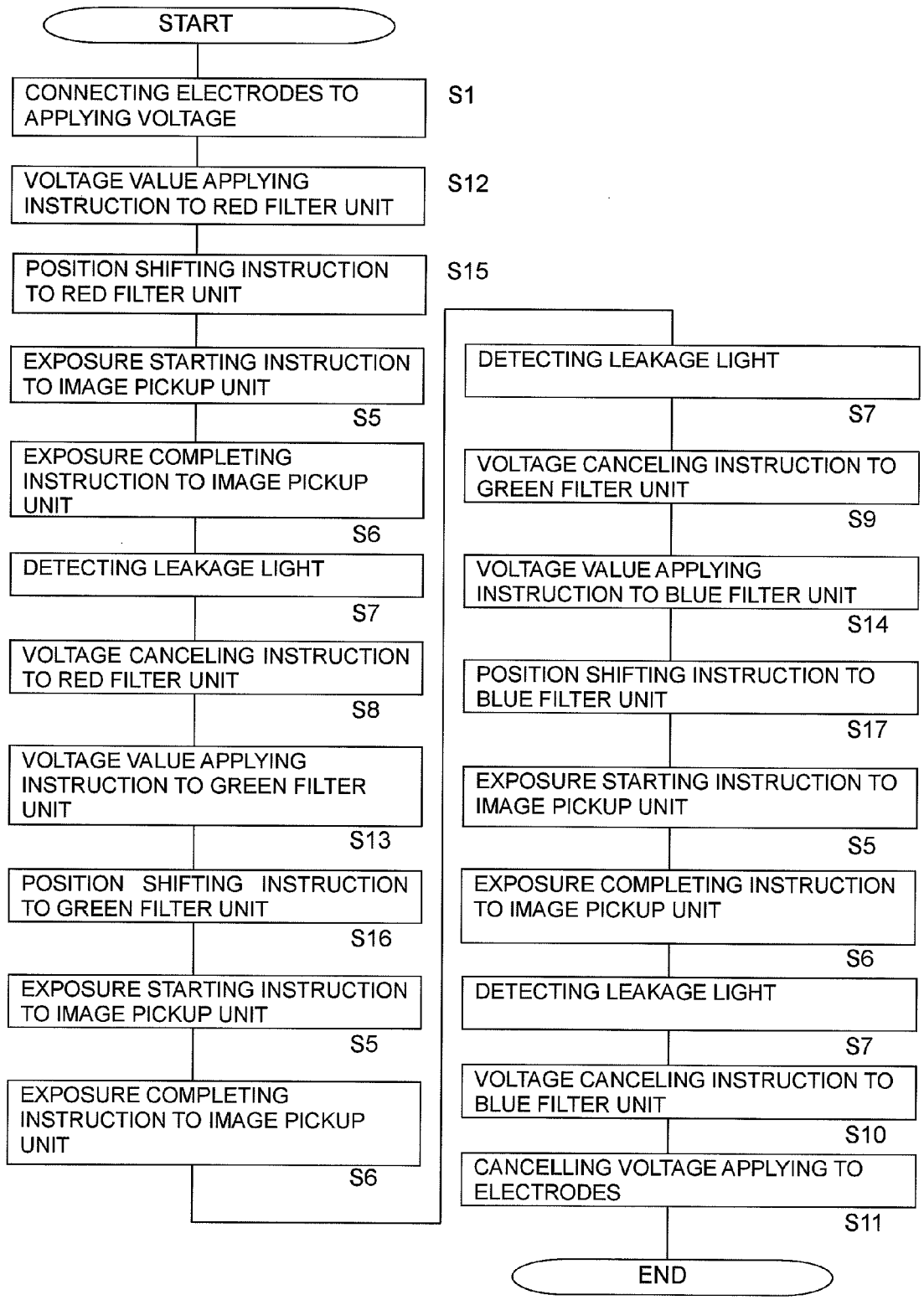
FIG. 8 is a flow chart showing inspection processes of an inspection method for the organic EL panel in accordance with the third embodiment.

FIG. 8 is a flow chart showing inspection processes of an organic EL panel inspection method in accordance with the third embodiment.

For example, FIG. 8 shows an organic EL panel provided with red, green and blue color filters, and S15 represents a step of instructing a shift of the red filter-unit position, S16 represents a step of instructing a shift of the green filter-unit position, and S17 represents a step of instructing a shift of the blue filter-unit position.

In FIG. 8, first, in order to apply a voltage to the organic EL panel in step S1 of connecting the voltage applying electrode, a voltage-applying power supply is connected to the electrodes. Next, a voltage value is applied to the organic EL panel in step 12 of the instruction for an application of a red filter-unit voltage. Next, in order to pick up an image of the leakage light emission position for the red filter in an optimal state in step S15 of the instruction for shifting the red filter position, the organic EL panel and the image-pickup element of the image pickup unit 57 are moved so as to have an optimal positional relationship.

Next, an exposure in the image pickup unit 57 is started in step S5 for instructing the start of exposure to the image pickup unit 57. Then, the exposure in the image pickup unit 57 is completed in step S6 for instructing the completion of exposure to the image pickup unit 57. In these steps S5 and S6, an image pickup process of a leakage light image in the red filter unit is carried out. Then, a detecting process for the leakage light is carried out in step S7 for detecting leakage light. In this case, the final determination may be carried out by a visual determination or may be carried out by an automatic determination by the use of image processing. Moreover, the connection between the electrode and the voltage application is cancelled in step S8 for instructing the cancellation of voltage application to the red filter unit.

Next, the same processes as those applied to the red filter are carried out on the green filter in the order of steps S13, S16, S5, S6, S7 and S9, and further carried out on the blue filter in the order of steps S14, S17, S5, S6, S7 and S10, so that voltage-applying power supply is cancelled from the electrodes in step S11 for the cancellation of the voltage-applying electrode. In this case, the processes for the respective filters of red, green and blue are not necessarily required to be carried out in these orders, and the application and cancellation of voltage may be carried out in any manner, as long as the voltage is applied at the time of picking up an image, and may also be carried out simultaneously on the respective filters of red, green and blue. Moreover, the order of the leakage light detecting processes may be changed, as long as the images of red, green and blue are stored so that the respective colors of red, green and blue are recognizable.

Next, referring to FIG. 15 and FIG. 16, the following description will discuss the setting of positions in steps S15 for instructing a shift of the red filter-unit position, S16 for instructing a shift of the green filter-unit position and S17 for instructing a shift of the blue filter-unit position.

It is supposed that a leakage light emission (red filter pixel) 701, a leakage light emission (green filter pixel) 702 and a leakage light emission (blue filter pixel) 703, shown in FIG. 15, have the completely same spectrum and the completely same intensity, and that the transmittances in the infrared-ray wavelength region of the red color filter 501, the green color filter 502 and the blue color filter 503 are the same. Further, it is supposed that the transmittances in the visible region become smaller in the order of the red color filter 501, the green color filter 502 and the blue color filter 503. In this case, as shown in FIG. 16, the total amounts of leakage light emission become smaller in the order of the amount of leakage light emission (visible to infrared wavelength regions) 804 passed through the red color filter, the amount of leakage light emission (visible to infrared wavelength regions) 805 passed through the green color filter and the amount of leakage light emission (visible to infrared wavelength regions) 806 passed through the blue color filter; however, an amount of leakage light emission 807 passed through the red color filter (infrared wavelength region), an amount of leakage light emission 808 passed through the green color filter (infrared wavelength region), and an amount of leakage light emission 809 passed through the blue color filter (infrared wavelength region) have the same quantity of light.

In this case, the rates of amounts in which infrared-ray components are contained in the leakage light 801 passed through the red color filter 501, the leakage light 802 passed through the green color filter 502 and the leakage light 803 passed through the blue color filter 503, shown in FIG. 15, are relatively varied. Therefore, due to the chromatic aberration between visible and near-infrared rays, the positions of the focal points of the image pickup unit 57 relative to the leakage light 801 passed through the red color filter 501, the leakage light 802 passed through the green color filter 502 and the leakage light 803 passed through the blue color filter 503 become different from one another. Therefore, the shifting process needs to be carried out to a position capable of achieving the best focus for each of the filters.

With respect to the focus of the image pickup unit 57, the chromatic aberration of an optical system inside the image pickup unit 57 tends to cause problems. In view of this problem, by using a material with small chromatic aberration, such as fluorite, as the lens material, for example, with the combination between the lenses and the image pickup element being made so as to reduce the aberration as small as possible, the influences from the chromatic aberration can be made smaller.

However, basically, it is impossible to reduce the lens aberration to zero. It is essential whether or not the aberration is set within a permissible range. The way how the aberration appears varies depending on the screen center, or the screen end or the lens diaphragm, at the time of picking up an image. For example, such an application may be proposed in which, although no positional correction is required in the case of the screen center, the correction is carried out only in the case of the screen end.

Additionally, the fluorite is expensive and causes a problem of costs. In particular, in the case where a large-size display is inspected, there are demands that the inspection is desirably carried out with an increased number of pixels of the image pickup unit 57 and that a high-speed inspection is desirably carried out, with the size of the image-pickup element being made as large as possible so that the quantum efficiency and the sensitivity are improved. In these cases, a large image circle is required for the lens. In such cases, the degree of difficulty in aberration correction becomes extremely higher, and a large-size lens is required to further cause a problem of high costs. Even in these cases, by the chromatic aberration correction using the focal point correction in accordance with the present embodiment, it becomes possible to use a lens in which the image circle is preferentially improved.

Fourth Embodiment

Figure 9:
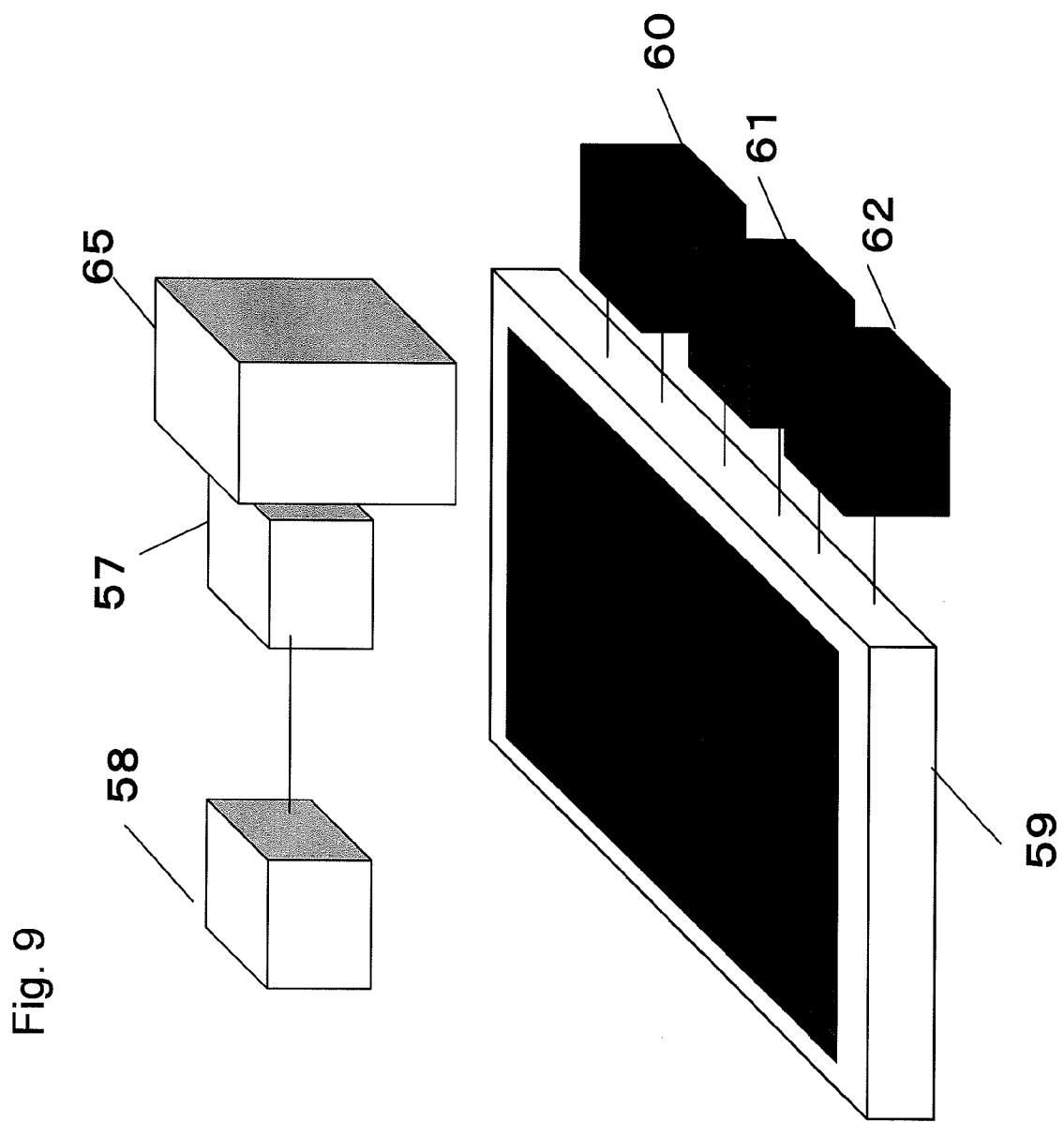
FIG. 9 is a structural view showing an inspection device for an organic EL panel in accordance with a fourth embodiment.

FIG. 9 is a structural view showing an inspection device for an organic EL panel in accordance with a fourth embodiment of the present invention, and those components that are the same as those of FIGS. 1, 4 and 7 are indicated by the same reference numerals, and the description thereof is not given here. In FIG. 9, reference numeral 65 represents an image pickup unit position setting unit.

In the inspection processes of the fourth embodiment, first, the red filter-unit voltage setting unit 60, the green filter-unit voltage setting unit 61 and the blue filter-unit voltage setting unit 62 are connected to electrodes of the organic EL display panel 59 with color filters. Next, voltages are individually applied to the red filter unit, the green filter unit and the blue filter unit of the organic EL display panel 59 with color filters from the red-filter unit voltage setting unit 60, the green-filter unit voltage setting unit 61 and the blue-filter unit voltage setting unit 62. In this stage, by applying a predetermined voltage, for example, a reverse bias voltage, to the organic EL panel, leakage light is generated when the organic EL layer has any defect.

Next, in the image pickup unit position setting unit 65, by controlling the image pickup unit 57 or by shifting the organic EL display panel 59, the focal point of the image pickup unit 57 and the organic EL display panel 59 with color filters is set to an optimal state. It is only necessary for this operation to be completed prior to an image pickup process of leakage light by the image pickup unit 57. Next, an image of the leakage light is picked up by the image pickup unit 57. Then, a defective leakage is detected by the leakage image detection unit 58. The final determination may be carried out by visual inspection on a displayed image on a display or the like, or may be automatically carried out by an image-processing apparatus.

Figure 10:
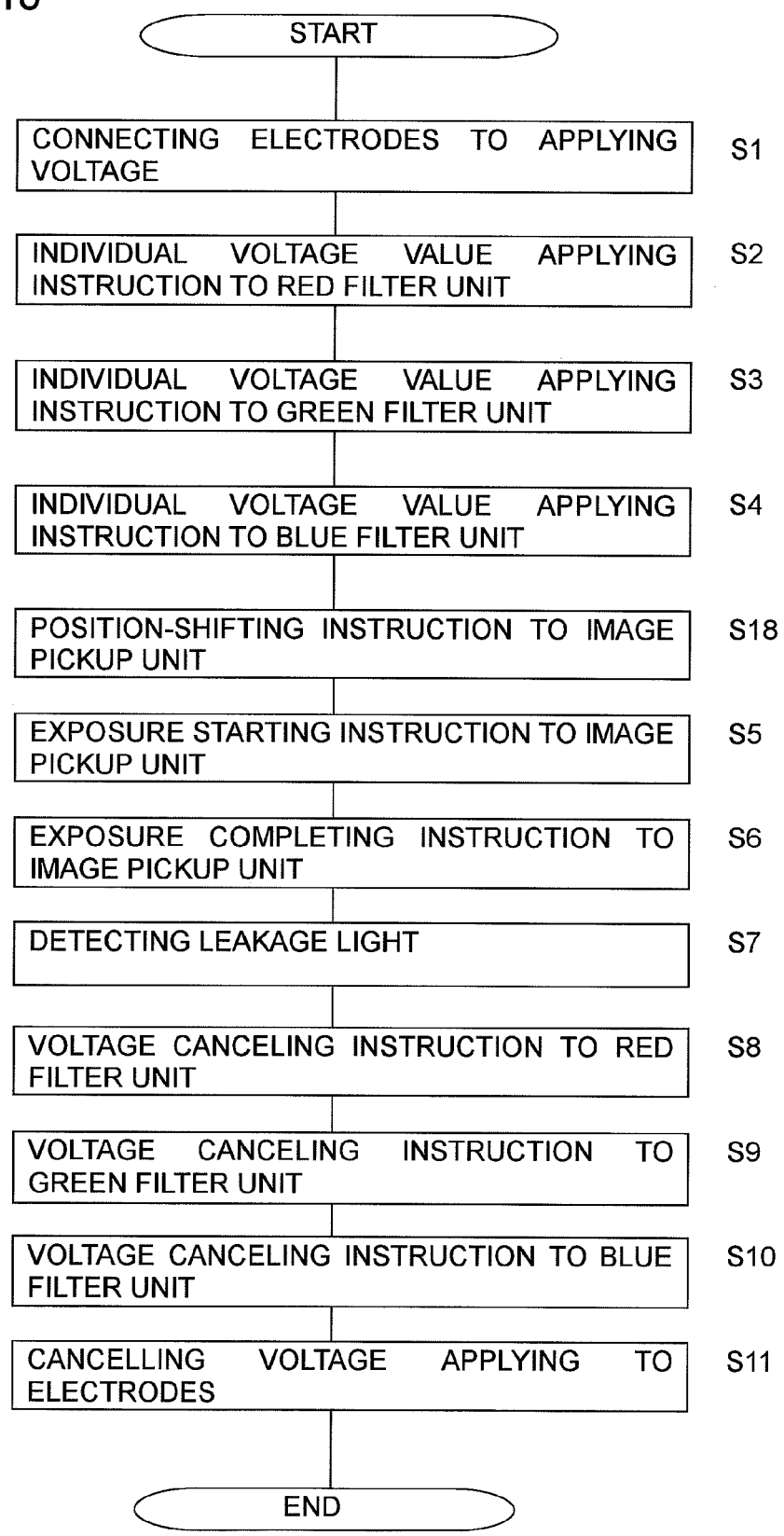
FIG. 10 is a flow chart showing inspection processes of an inspection method for the organic EL panel in accordance with the fourth embodiment.

FIG. 10 is a flow chart showing inspection processes of an organic EL panel inspection method in accordance with the fourth embodiment, and those steps that are the same as those of FIGS. 2, 5 and 8 are indicated by the same reference numerals, and the description thereof is not given here. FIG. 8, for example, shows an organic EL panel provided with red, green and blue color filters, and S18 represents a step of instructing a positional shift to the image pickup unit 57.

In FIG. 10, first, in order to apply a voltage to the organic EL panel in step S1 of connecting the voltage applying electrode, a voltage-applying power supply is connected to the electrodes. Next, an individual voltage value for the red filter is applied to the red filter unit in step S2 of the instruction for an application of a red filter-unit individual voltage value, an individual voltage value for the green filter is applied to the green filter unit in step S3 of the instruction for an application of a green filter-unit individual voltage value, and an individual voltage value for the blue filter is applied to the blue filter unit in step S4 of the instruction for an application of a blue filter-unit individual voltage value. In the present example, the steps are divided depending on the respective filters of red, green and blue colors, and the flow is executed in the order of red, green and blue; however, the order may be changed within this range, and voltages may be applied simultaneously.

In this stage, by applying a predetermined voltage, for example, a reverse bias voltage, to the organic EL panel, leakage light is generated in the case where there is a defect in the organic EL layer. Next, in step S18 of instructing a positional shift to the image pickup unit 57, a shifting process is executed to a focal point position that makes the relative distance to the reference leakage light emission focal point position shortest for each of the color filter types. This process will be described later separately.

Next, an exposing process in the image pickup unit 57 is started in step S5 for instructing the start of exposure to the image pickup unit 57, and the exposing process in the image pickup unit 57 is completed in step S6 for instructing the completion of exposure to the image pickup unit 57. In these steps S5 and S6, an image pickup process of a leakage light image is carried out. Then, a detecting process for the leakage light is carried out in step S7 for detecting leakage light. The final determination may be carried out by a visual determination or may be carried out by an automatic determination by the use of image processing. Moreover, step S7 for detecting leakage light may be carried out in any order, as long as it is carried out after step S6 for instructing the completion of exposure to the image pickup unit 57.

Moreover, step S8 for instructing the cancellation of the red filter-unit voltage, step S9 for instructing the cancellation of the green filter-unit voltage and step S10 for instruction of the cancellation of the blue filter-unit voltage are carried out so that the voltage application to the organic EL panel is cancelled. In the present embodiment, the steps are divided depending on the respective filters of red, green and blue colors, and the flow is executed in the order of red, green and blue; however, the order may be changed within this range, and the voltages may be cancelled simultaneously. Then, in step S11 for canceling the voltage application electrode, the applying power supply is cancelled from the electrodes.

With respect to the setting of the position in S18 for instructing a positional shift to the image pickup unit 57, due to the chromatic aberration between visible and near-infrared rays shown in FIG. 15, the positions of the focal points of the image pickup unit 57 relative to the leakage light 801 passed through the red color filter 501, the leakage light 802 passed through the green color filter 502 and the leakage light 803 passed through the blue color filter 503 become different from one another. Therefore, the best focused positions, that is, more specifically, the leakage light emission focal point reference positions for red, blue and green, are preliminarily found for the respective filters of red, green and blue, and the focal point position may be adjusted so as to make the relative distance to the reference leakage light emission focal point position shortest for each of the color filter types.

As described earlier, the way how the aberration appears varies depending on the screen center, or the screen end or the lens diaphragm at the time of picking up an image. More specifically, such an application may be proposed in which, with the diaphragm of the lens being opened wider than that in the normal detection, the correcting process may be carried out by adjusting the focal point by using the screen end as much as possible. Moreover, since the states of the focal point are changed depending on the models of the organic EL panel to be inspected, such an application may be proposed in which, although the same position is used in the case of the same model, the position is shifted for each of different models.

Figure 11:
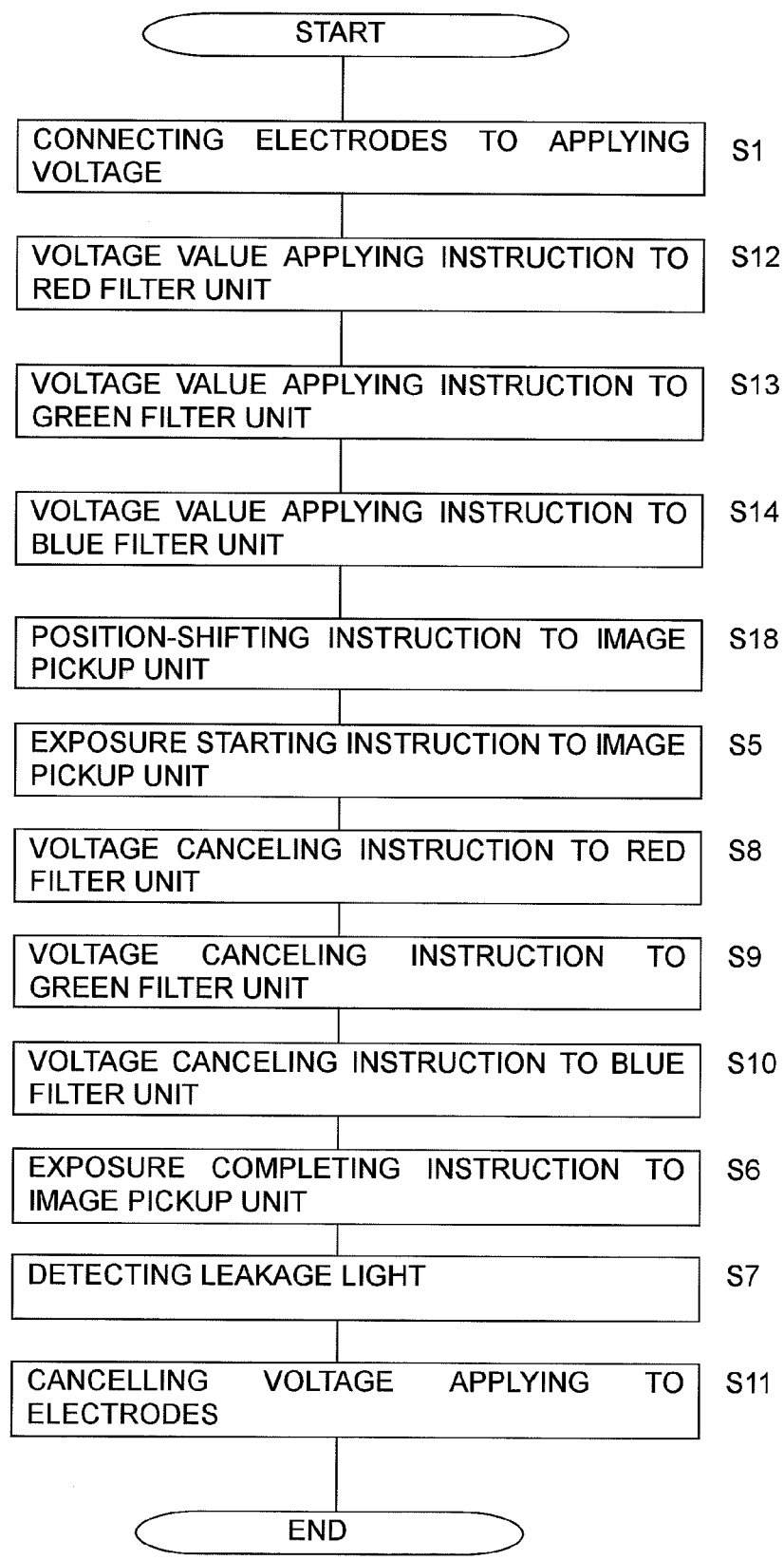
FIG. 11 is a flow chart showing other inspection processes of the inspection method for the organic EL panel in accordance with the fourth embodiment.

Furthermore, the sequence of FIG. 10 may be changed to that shown in FIG. 11. In the flow chart of FIG. 11, in the same manner as in the flow chart of the inspection method for an organic EL panel in accordance with the second embodiment, the voltage applying timing is changed for each of the filter types.

Fifth Embodiment

FIG. 12 is an explanatory view showing an essential portion of an inspection device for an organic EL panel in accordance with a fifth embodiment of the present invention. Reference numeral 29 represents a red filter, 30 represents a green filter, 31 represents a blue filter, 32 represents a light source for red, 33 represents a light source for green, 34 represents a light source for blue, 35 represents an outgoing light from the light source for red, 36 represents an outgoing light from the light source for green, 37 represents an outgoing light from the light source for blue, 38 represents an outgoing light from the light source for red that has passed through the red filter, 39 represents an outgoing light from the light source for green that has passed through the green filter, and 40 represents an outgoing light from the light source for blue that has passed through the blue filter.

In the present fifth embodiment, the ratios of the amounts of light emissions of the outgoing light 38 from the light source for red 32 that has passed through the red filter 29, the outgoing light 39 from the light source for green 33 that has passed through the green filter 30, and the outgoing light 40 from the light source for blue 34 that has passed through the blue filter 31 are made equivalent to one another, by allowing the ratios of quantities of light of the leakage light for the respective filter types that have been emitted from the organic EL panel or the like with color filters to be inspected, and measured through the respective color filters to be set within reference permissible values, and are then utilized for generating leakage light that form references to be used for the leakage light detection.

Essentially, it is preferable to use the organic EL leakage light itself; however, since the organic EL leakage light has a change with time, it is sometimes difficult to use the organic EL leakage light as a stable reference. Therefore, in an attempt to remove the factor of the change with time, the light source for red 32, the light source for green 33, and the light source for blue 34 are made to have a light emission state that is different from the light emission of the organic EL defective leakage. Consequently, it is necessary to facilitate calibration relative to the leakage light emitted from an organic EL panel or the like with color filters to be inspected.

Moreover, since the leakage light is very weak and very little, the size and the intensity thereof may be adjusted, for example, by inserting a light-reducing filter, a pin hole or the like between the red filter 29 and the light source for red 32. Alternately, the intensity may be electrically changed by using a fine light source, such as an LED.

Sixth Embodiment

Figure 13:
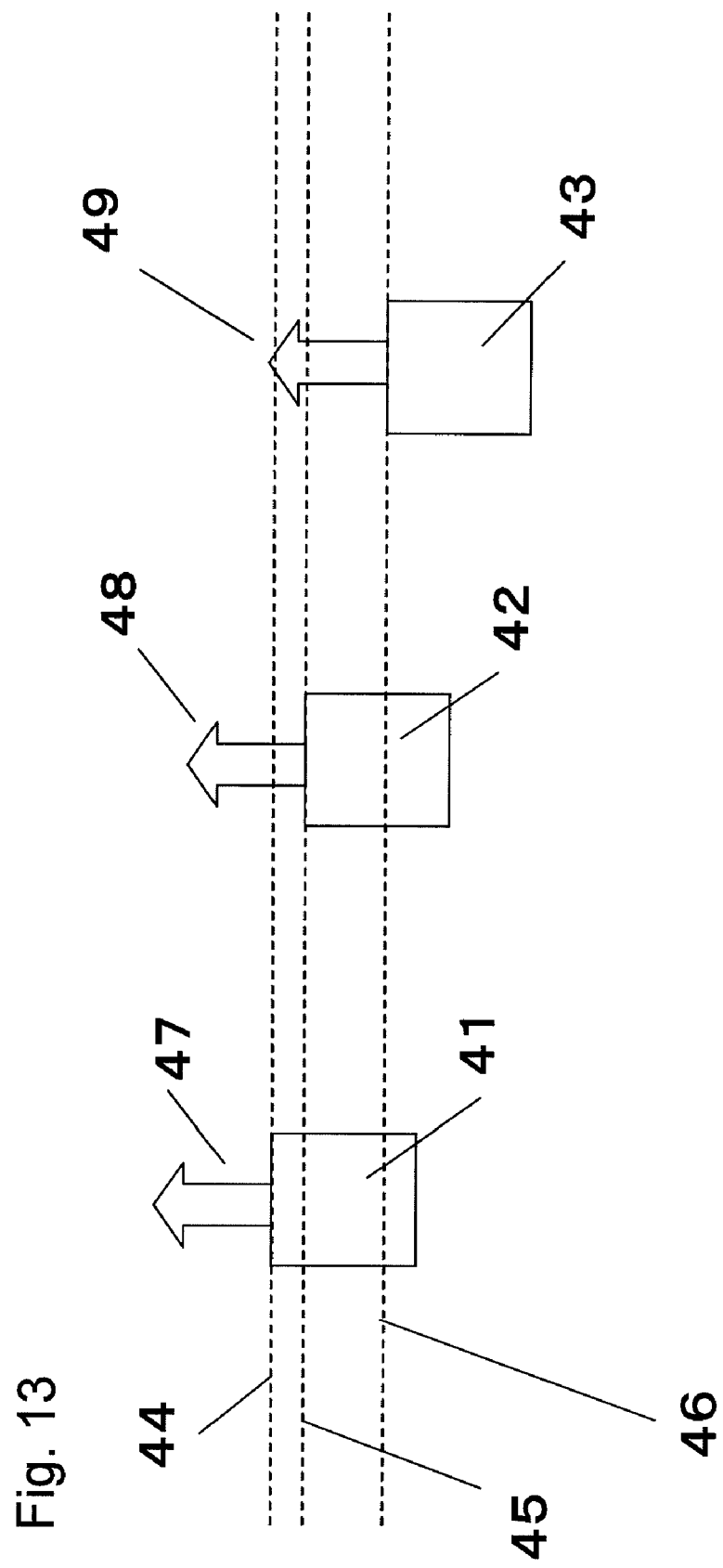
FIG. 13 is an explanatory view showing an essential portion in the inspection device for the organic EL panel in accordance with a fifth embodiment.
Figure 14:
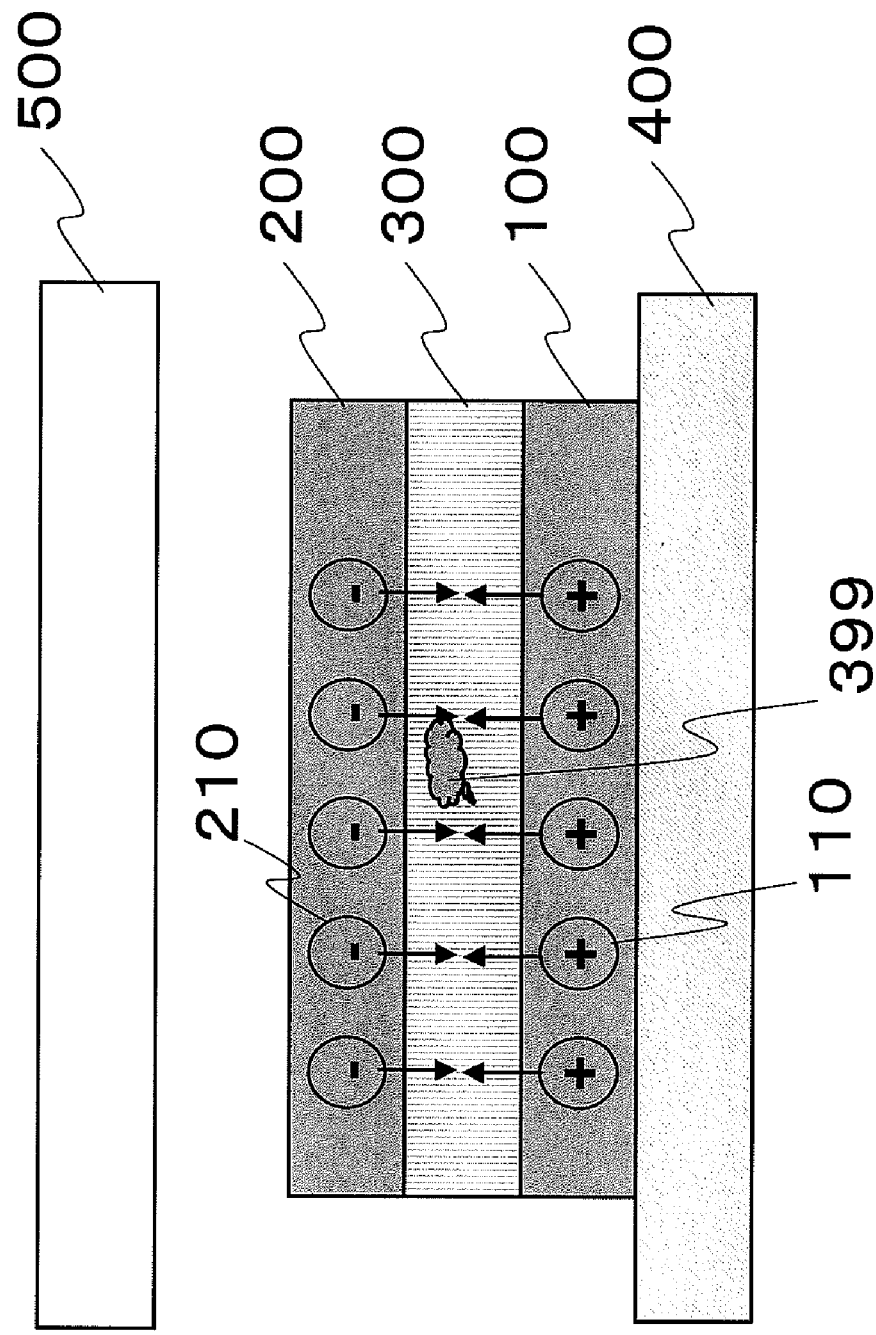
FIG. 14 is a schematic structural view showing a general organic EL element.

FIG. 13 is an explanatory view showing an essential portion of an inspection device for an organic EL panel in accordance with a sixth embodiment of the present invention, and reference numeral 41 represents a non-infrared light source for red, 42 represents a non-infrared light source for green, 43 represents a non-infrared light source for blue, 44 represents a focal point reference face for an outgoing light from the non-infrared light source for red, 45 represents a focal point reference face for an outgoing light from the non-infrared light source for green, 46 represents a focal point reference face for an outgoing light from the non-infrared light source for blue, 47 represents an outgoing light from the non-infrared light source for red, 48 represents an outgoing light from the non-infrared light source for green, and 49 represents an outgoing light from the non-infrared light source for blue.

In the present sixth embodiment, the heights of the respective light sources 41 to 43 containing no infrared-ray wavelengths are individually set to heights that correspond to leakage light emission focal point positions for the respective types of color filters in an organic EL panel with a plurality of color filters to be inspected.

As described earlier, since the organic EL leakage light has a change with time, it is sometimes difficult to use the organic EL leakage light as a stable reference. Therefore, in an attempt to remove the factor of the change with time, it is necessary to use light-emitting unit having a light-emitting system different from the light emission of the organic EL defective leakage.

In this case, it is preferable to generate completely the same spectrum as that of the organic EL defective leakage light emission; however, the generation of such a spectrum is very difficult. Therefore, by removing ambiguous infrared components so that the influences from the infrared components are converted to the heights themselves, the reference of the focal point position can be easily generated. Therefore, the outgoing light 47, the outgoing light 48, and the outgoing light 49, which contain no infrared components, are respectively released from the non-infrared light source for red 41, the non-infrared light source for green 42, and the non-infrared light source for blue 43. Moreover, the focal point reference face 44 for an outgoing light from the non-infrared light source for red, the focal point reference face 45 for an outgoing light from the non-infrared light source for green and the focal point reference face 46 for an outgoing light from the non-infrared light source for blue are individually set to respective heights relative to leakage light emission focal point positions for the respective types of color filters in an organic EL panel with a plurality of color filters to be inspected.

The present invention makes it possible to detect a defective organic EL film at high speeds with high efficiency, even in the case of an organic EL panel with color filters, by detecting a leakage light emission while correcting differences in the intensity and focal point for each of filter types. Therefore, it becomes possible to cut costs of an inspection device so as to satisfy the expanded applications of organic EL panels, and also to address demands or the like for a high-speed detection in association with demands for large-size organic EL panels. More specifically, the present invention is applicable to inspection processes for defects occurring in an organic EL element or a pixel of an organic EL panel, such as an electrical leakage defective position occurring in an organic EL element or a pixel of an organic EL panel made of the organic EL element, deviations in film thickness in an anode, an EL light-emission unit, and a cathode that form the organic EL element, a defective interface in each of components, and degradation of an organic EL layer.

What is claimed is:

1. An inspection method for an organic electroluminescence panel comprising:
    applying a predetermined voltage to each of pixels of color filters of respective types relative to an organic electroluminescence panel on which the color filters of the respective types are installed;
    detecting the leakage light transmitted from each of the color filters of the respective types, with respect to leakage light generated from the organic electroluminescence panel;

adjusting each of the amounts of light emissions of the leakage light detected from the color filters of the respective types so as to be set within reference permissible values for each of the color filters of all the types; and inspecting the organic electroluminescence panel based upon the amount of light emission of each of the leakage light detected from the color filters of the respective types of the organic electroluminescence panel.

2. The inspection method for an organic electroluminescence panel according to claim 1, wherein in the adjusting step, by individually setting a predetermined voltage to be applied to each of the color filters of the respective types, each of the amounts of light emissions of the leakage light is controlled so as to be set within the reference permissible values for each of the color filters of all the types.

3. The inspection method for an organic electroluminescence panel according to claim 1, wherein in the step of detecting the leakage light transmitted from each of the color filters of the respective types, by picking up an image of the organic electroluminescence panel by using an image pickup element, the detection of the leakage light is carried out, and upon picking up the image, by individually setting a positional relationship between the organic electroluminescence panel and the image pickup element for each of the color filters of the respective types, the transmitted leakage light is detected for each of the color filters of the respective types.

4. The inspection method for an organic electroluminescence panel according to claim 3, wherein in the detecting step, upon detecting the leakage light by picking up an image of the organic electroluminescence panel by the image pickup element, since the leakage light, transmitted through each of the color filters of the respective types, contains infrared-ray wavelength components, by preliminarily finding a reference leakage light emission focal point position, an adjusting step is carried out to a focal point position that makes the relative distance from the leakage light emission focal point for each of the color filters of the respective types to the reference leakage light emission focal point position shortest.

5. A repairing method for an organic electroluminescence panel comprising:

the respective steps of the inspection method for an organic electroluminescence panel according to claim 1; and repairing the organic electroluminescence panel based upon the inspection results of the inspection step.

6. An inspection device for an organic electroluminescence panel comprising:

an individual voltage applying unit operable to individually apply a predetermined voltage to each of pixels of color filters of respective types relative to an organic electroluminescence panel on which the color filters of the respective types are installed;

a leakage light detection unit operable to detect the leakage light transmitted from each of the color filters of the respective types, with respect to leakage light generated from the organic electroluminescence panel;

a control unit operable to adjust each of the amounts of light emissions of the leakage light transmitted through the color filters of the respective types so as to be set within reference permissible values for each of the color filters of all the types, by setting an applying voltage value to be individually given to each of the color filters by the individual voltage applying unit; and an inspection unit operable to inspect the organic electroluminescence panel based upon the amount of light emission of each of the leakage light detected from the color filters of the respective types of the organic electroluminescence panel.

7. The inspection device for an organic electroluminescence panel according to claim 6, wherein the control unit individually sets an applying voltage value to be applied to each of the color filters of the respective types by the individual voltage applying unit so that each of the amounts of light emissions of the leakage light is controlled so as to be set within the reference permissible values for each of the color filters of all the types.

8. The inspection device for an organic electroluminescence panel according to claim 6, wherein the leakage light detection unit detects the leakage light by picking up an image by using an image pickup element for each of the color filters of the respective types, further comprising:

a focal point adjusting unit operable to individually set a positional relationship between the organic electroluminescence panel and the image pickup element.

9. The inspection device for an organic electroluminescence panel according to claim 6, further comprising:

a plurality of filter unit, each having a transmitting wavelength region equivalent to that of a color filter possessed by the organic electroluminescence panel; and a plurality of light-emitting unit that are placed in association with the filter unit, and exert a light-emission state different from a defective leakage light emission.

10. A repairing device for an organic electroluminescence panel comprising:

the respective units of the inspection device for an organic electroluminescence panel according to claim 6; and a repairing unit operable to repair the organic electroluminescence panel based upon the inspection results of the inspection unit.

* * * * *